(12) United States Patent
Katayama et al.

(10) Patent No.: US 11,142,073 B2
(45) Date of Patent: Oct. 12, 2021

(54) ANALYTICAL DEVICE, ANALYSIS METHOD, MANUFACTURING METHOD, ELECTRIC STORAGE DEVICE, ELECTRIC STORAGE SYSTEM, ELECTRONIC DEVICE, ELECTRIC VEHICLE AND ELECTRIC POWER SYSTEM

(71) Applicant: MURATA MANUFACTURING CO., LTD., Kyoto (JP)

(72) Inventors: Shinichi Katayama, Kyoto (JP); Hideki Nakai, Kyoto (JP); Akinori Kita, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 202 days.

(21) Appl. No.: 16/144,471

(22) Filed: Sep. 27, 2018

(65) Prior Publication Data

US 2019/0023131 A1  Jan. 24, 2019

Related U.S. Application Data

(63) Continuation of application No. PCT/JP2017/002907, filed on Jan. 27, 2017.

(30) Foreign Application Priority Data

Apr. 12, 2016 (JP) .............................. JP2016-079628

(51) Int. Cl.
 *B60L 3/00* (2019.01)
 *B60L 58/16* (2019.01)
 (Continued)

(52) U.S. Cl.
 CPC ............ *B60L 3/0046* (2013.01); *B60L 50/64* (2019.02); *B60L 58/16* (2019.02); *G01N 17/02* (2013.01);
 (Continued)

(58) Field of Classification Search
 CPC .......... B60L 3/00; B60L 3/0046; B60L 58/00; B60L 58/16; B60L 50/64;
 (Continued)

(56) References Cited

U.S. PATENT DOCUMENTS

2012/0316815 A1\* 12/2012 Morigaki ............. G01R 31/392
 702/63
2014/0287287 A1   9/2014 Osaka et al.
 (Continued)

FOREIGN PATENT DOCUMENTS

CN   104914312 A  \*  9/2015
CN   105137362 A  \* 12/2015
 (Continued)

OTHER PUBLICATIONS

P. Büschel, T. Gunther and O. Kanoun, "Distribution of relaxation times for effect identification and modeling of impedance spectra," 2014 IEEE International Instrumentation and Measurement Technology Conference (I2MTC) Proceedings, Montevideo, 2014, pp. 901-904, doi: 10.1109/I2MTC.2014.6860872. (Year: 2014).\*

(Continued)

*Primary Examiner* — Jeffrey C Boomer
*Assistant Examiner* — Paul Allen
(74) *Attorney, Agent, or Firm* — K&L Gates LLP

(57) ABSTRACT

An analytical device is provided. The analytical device includes a battery condition analysis section configured to detect a state change of a constituent member of a battery based on a change in peak of a relaxation time in a predetermined frequency band.

10 Claims, 14 Drawing Sheets

(51) Int. Cl.

| | |
|---|---|
| *H01M 10/42* | (2006.01) |
| *G01N 17/02* | (2006.01) |
| *G01R 31/367* | (2019.01) |
| *H01M 10/48* | (2006.01) |
| *G01R 31/389* | (2019.01) |
| *G01R 31/392* | (2019.01) |
| *H01M 10/052* | (2010.01) |
| *B60L 50/64* | (2019.01) |
| *H01M 10/0587* | (2010.01) |

(52) U.S. Cl.
CPC ......... *G01R 31/367* (2019.01); *G01R 31/389* (2019.01); *G01R 31/392* (2019.01); *H01M 10/052* (2013.01); *H01M 10/0587* (2013.01); *H01M 10/425* (2013.01); *H01M 10/48* (2013.01); *B60L 2240/545* (2013.01); *H01M 2010/4278* (2013.01); *H01M 2220/20* (2013.01)

(58) Field of Classification Search
CPC ... B60L 2240/545; G01R 23/00; G01R 27/00; G01R 31/00; G01R 31/36–396; G01R 31/367; G01R 31/389; G01R 31/392; H01M 10/48–488; H01M 10/0587; H01M 10/052; H01M 10/425; H01M 2010/4278; H01M 2220/20; G01N 17/02
USPC ............................... 324/425–450; 702/57–80
See application file for complete search history.

(56) References Cited

U.S. PATENT DOCUMENTS

| | | | |
|---|---|---|---|
| 2016/0131719 A1 | 5/2016 | Takahashi | |
| 2017/0120770 A1* | 5/2017 | Huynh | .................. H02J 7/0026 |

FOREIGN PATENT DOCUMENTS

| | | |
|---|---|---|
| JP | 2013-088148 A | 5/2013 |
| JP | 2014-010037 A | 1/2014 |
| JP | 2014-134467 A | 7/2014 |
| JP | 2015-021774 A | 2/2015 |

OTHER PUBLICATIONS

Jörg Illig, Thorsten Chrobak, Moses Ender, Jan Philipp Schmidt, Dino Klotz and Ellen Ivers-Tiffée "Studies on LiFePO4 as Cathode Material in Li-Ion Batteries," 2010 ECS—The Electrochemical Society ECS Transactions, vol. 28, No. 30 (Year: 2010).*

Klotz, Dino & Schmidt, Jan & Kromp, Alexander & Weber, André & Ivers-Tiffée, Ellen. (2012). The Distribution of Relaxation Times as Beneficial Tool for Equivalent Circuit Modeling of Fuel Cells and Batteries. ECS Transactions. 41. 25-33. 10.1149/1.3692958. (Year: 2012).*

M. Eckert, L. Kölsch and S. Hohmann, "Fractional algebraic identification of the distribution of relaxation times of battery cells," 2015 54th IEEE Conference on Decision and Control (CDC), Osaka, 2015, pp. 2101-2108, doi: 10.1109/CDC.2015.7402517. (Year: 2015).*

Schichlein, H., Müller, A., Voigts, M. et al. Deconvolution of electrochemical impedance spectra for the identification of electrode reaction mechanisms in solid oxide fuel cells. Journal of Applied Electrochemistry 32, 875-882 (2002). https://doi.org/10.1023/A:1020599525160 (Year: 2002).*

Yan Mufu—English Translation of CN-104914312-A via Espacenet Patent Translate, retrieved Aug. 18, 2020 (Year: 2020).*

Hess, M.. "Kinetics and stage transitions of graphite for lithium-ion batteries." (2013). (Year: 2013).*

Chen Jing—English description and claims of CN-105137362-A via Espacenet Patent Translate, retrieved May 27, 2021 (Year: 2021).*

International Search Report and Written Opinion issued in connection with International Patent Application No. PCT/JP2017/002907, dated Apr. 4, 2017. (9 pages).

* cited by examiner

ANALYTICAL DEVICE, ANALYSIS METHOD, MANUFACTURING METHOD, ELECTRIC STORAGE DEVICE, ELECTRIC STORAGE SYSTEM, ELECTRONIC DEVICE, ELECTRIC VEHICLE AND ELECTRIC POWER SYSTEM

CROSS REFERENCE TO RELATED APPLICATIONS

The present application is a continuation of PCT patent application no. PCT/JP2017/002907, filed on Jan. 27, 2017, which claims priority to Japanese patent application no. JP2016-079628 filed on Apr. 12, 2016, the entire contents of which are being incorporated herein by reference.

BACKGROUND

The present technology generally relates to an analytical device, an analysis method, a manufacturing method, an electric storage device, an electric storage system, an electronic device, an electric vehicle and an electric power system.

In recent years, applications of secondary batteries including lithium ion secondary batteries, such as power sources for automobiles, as well as domestic power sources are expanding. As a method of analyzing the internal state of such a secondary battery, an AC impedance method (EIS: Electrochemical Impedance Spectroscopy) is known.

SUMMARY

The present technology generally relates to an analytical device, an analysis method, a manufacturing method, an electric storage device, an electric storage system, an electronic device, an electric vehicle and an electric power system.

In such a field, it is desired to analyze an internal state or state change of the battery.

Accordingly, the present technology aims to provide an analytical device, an analysis method, a manufacturing method, an electric storage device, an electric storage system, an electronic device, an electric vehicle and an electric power system that analyze an internal state or state change of a battery.

According to an embodiment of the present technology, an analytical device is provided. The analytical device includes a battery condition analysis section configured to detect a state change of constituent members of a battery based on a change in peak of a relaxation time in a predetermined frequency band.

According to another embodiment of the present technology, an analytical device includes a battery condition analysis section configured to detect a state of constituent members of a battery based on a peak of a relaxation time in a predetermined frequency band.

According to another embodiment of the present technology, an analysis method is provided. The analysis method is for detecting a state change of constituent members of a battery based on a change in peak of a relaxation time in a predetermined frequency band by a battery condition analysis section.

According to an embodiment of the present technology, a method for manufacturing a battery is provided. The method includes the steps of:

assembling constituent members of a battery; and detecting a state change of the constituent members of a battery based on a peak of a relaxation time in a predetermined frequency band by a battery condition analysis section.

According to an embodiment of the present technology, an electric storage device includes a battery; and a battery condition analysis section configured to detect a state change of constituent members of the battery based on a change in peak of a relaxation time in a predetermined frequency band.

Further, According to an embodiment of the present technology, an electric storage system includes the electric storage device as described herein and a controller configured to control the electric storage device.

Further, according to another embodiment of the present technology, the present technology may be an electronic device connected to the electric storage device as described herein and configured to receive supply of electric power from the electric storage device.

According to another embodiment of the present technology, the present technology may be an electric vehicle including the electric storage device as described herein and a conversion device configured to receive supply of electric power from the electric storage device and convert the electric power into a driving force of a vehicle. Further, the present technology may be an electric vehicle further including a controller configured to perform information processing on vehicle control based on information on the electric storage device according to an embodiment of the present technology.

According to an embodiment of the present technology, an electric power system includes the electric storage device as described herein and is configured to receive supply of electric power from the electric storage device.

According to at least one embodiment of the present technology, the internal state or state change of the battery can be analyzed. It should be understood that additional features and advantages are described herein, and will be apparent from the following Detailed Description and the figures.

DETAILED DESCRIPTION

The present technology generally relates to an analytical device, an analysis method, a manufacturing method, an electric storage device, an electric storage system, an electronic device, an electric vehicle and an electric power system. As described herein, the present disclosure will be described based on examples with reference to the drawings, but the present disclosure is not to be considered limited to the examples, and various numerical values and materials in the examples are considered by way of example.

Figure 1:
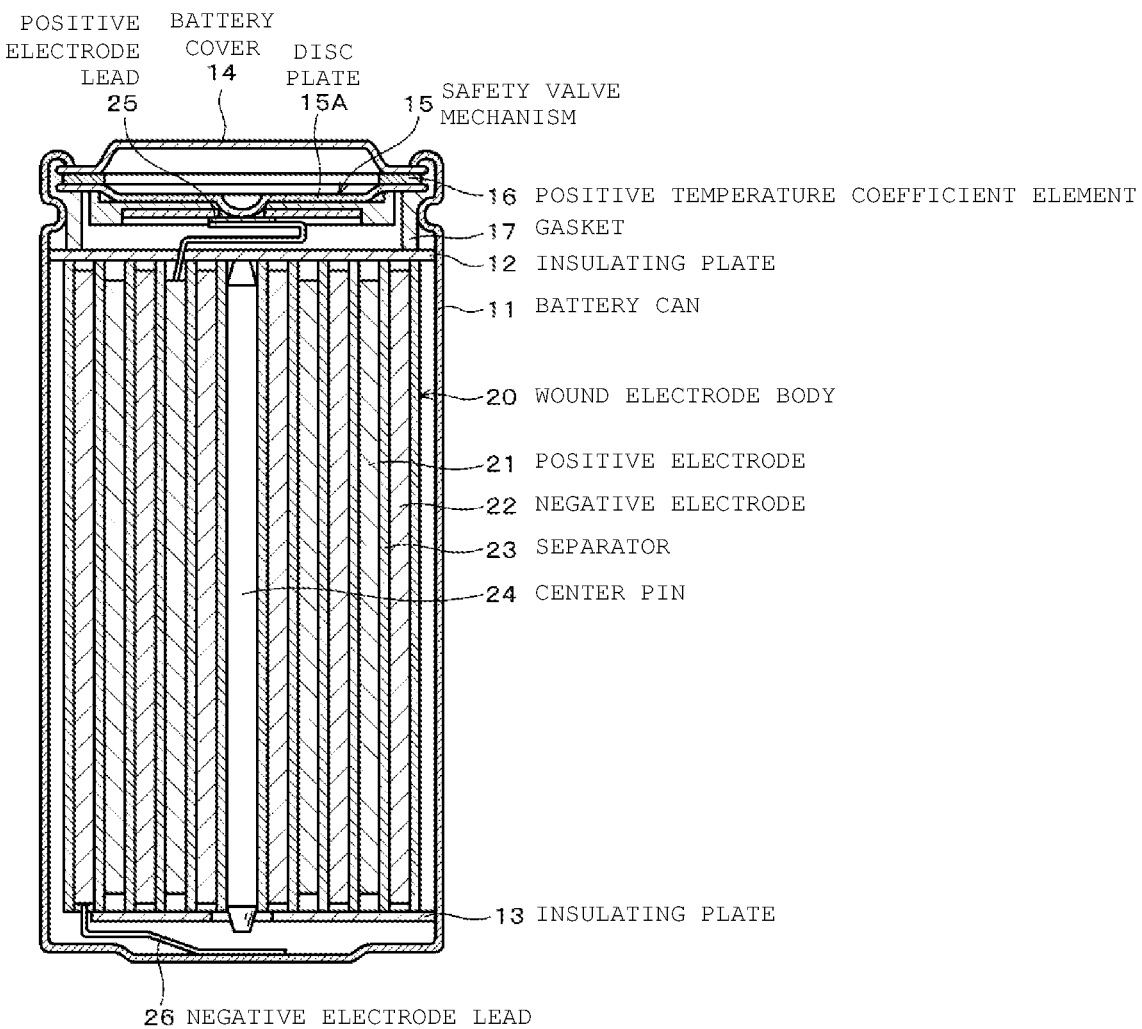
FIG. 1 is a view illustrating a configuration example of a battery according to an embodiment of the present technology.

Hereinafter, a configuration example of a nonaqueous electrolyte secondary battery used in an electric storage system according to an embodiment of the present technology will be described with reference to FIG. 1. The nonaqueous electrolyte secondary battery is, for example, a so-called lithium ion secondary battery in which the capacity of a negative electrode is expressed by the capacity component based on absorption and release of lithium (Li) serving as an electrode reactant. The nonaqueous electrolyte secondary battery is a so-called cylindrical type, and includes, in a substantially hollow cylindrical battery can 11, a wound electrode body 20 in which a pair of a band-shaped positive electrodes 21 and a band-shaped negative electrode 22 are laminated with a separator 23 interposed therebetween, and wound. The battery can 11 is made of iron (Fe) plated with nickel (Ni), and one end thereof is closed and the other end thereof is opened. An electrolytic solution as a liquid electrolyte is injected into the battery can 11, and the positive electrode 21, the negative electrode 22, and the separator 23 are impregnated with the electrolytic solution. A pair of insulating plates 12, 13 are disposed perpendicularly to the circumferential surface of a wound body so as to sandwich the wound electrode body 20.

A battery cover 14, a safety valve mechanism 15 provided inside the battery cover 14, and a positive temperature coefficient element (PTC element) 16 are attached to the open end of the battery can 11 by being crimped with a sealing gasket 17 interposed therebetween. Thereby, the inside of the battery can 11 is hermetically sealed. The battery cover 14 is made of, for example, the same material as the battery can 11. The safety valve mechanism 15 is electrically connected to the battery cover 14, and configured such that a disk plate 15A is inverted to cut electrical connection between the battery cover 14 and the wound electrode body 20 when an internal pressure of the battery becomes equal to or higher than a certain level due to internal short-circuit, heating from the outside or the like. The sealing gasket 17 includes, for example, an insulating material, and its surface is coated with asphalt.

A center pin 24 is inserted in the center of the wound electrode body 20. A positive electrode lead 25 made of aluminum (Al) or the like is connected to the positive electrode 21 of the wound electrode body 20, and a negative electrode lead 26 made of nickel or the like is connected to the negative electrode 22. The positive electrode lead 25 is welded to the safety valve mechanism 15 to be electrically connected to the battery cover 14, and the negative electrode lead 26 is welded to the battery can 11 to be electrically connected to the battery can 11.

Figure 2:
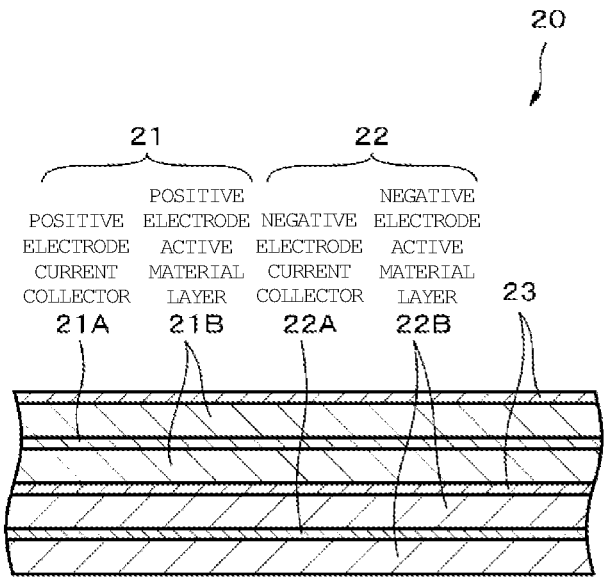
FIG. 2 is a view illustrating a configuration example of a battery according to an embodiment of the present technology.

Hereinafter, the positive electrode 21, the negative electrode 22, the separator 23, and the electrolytic solution constituting the nonaqueous electrolyte secondary battery will be sequentially described with reference to FIG. 2.

The positive electrode 21 has a structure in which, for example, a positive electrode active material layer 21B is provided on both surfaces of a positive electrode current collector 21A. Although not shown, the positive electrode active material layer 21B may be provided only on one surface of the positive electrode current collector 21A. The positive electrode current collector 21A includes, for example, a metal foil such as an aluminum foil, a nickel foil, or a stainless steel foil. The positive electrode active material layer 21B contains, for example, a positive electrode active material capable of absorbing and releasing lithium serving as an electrode reactant. The positive electrode active material layer 21B may further contain an additive, as required. As the additive, for example, at least one of a conductive agent and a binder can be used.

As the positive electrode material capable of absorbing and releasing lithium, for example, lithium-containing compounds such as lithium oxide, lithium phosphorus oxide, lithium sulfide and an interlayer compound containing lithium are appropriate, and two or more of these compounds may be mixed and used. In order to increase an energy density, a lithium-containing compound containing lithium, a transition metal element, and oxygen (O) is preferred. Examples of such a lithium-containing compound include lithium composite oxides having a layered rock-salt type structure represented by the formula (A) and lithium composite phosphates having an olivine type structure represented by the formula (B). It is more preferred that the lithium-containing compound contains at least one selected from the group consisting of cobalt (Co), nickel, manganese (Mn) and iron as the transition metal element. Examples of such a lithium-containing compound include lithium composite oxides having a layered rock-salt type structure represented by the formula (C), formula (D) or formula (E), lithium composite oxides having a spinel type structure represented by the formula (F), and lithium composite phosphates having an olivine type structure represented by the formula (G). Specific examples thereof include $LiNi_{0.50}Co_{0.20}Mn_{0.30}O_2$, $Li_aCoO_2$ ($a\approx1$), $Li_bNiO_2$ ($b\approx1$), $Li_{c1}Ni_{c2}Co_{1-c2}O_2$ ($c1\approx1$, $0<c2<1$), $Li_dMn_2O_4$ ($d\approx1$) and $Li_eFePO_4$ ($e\approx1$).

$$Li_pNi_{(1-q-r)}Mn_qM1_rO_{(2-y)}X_z \tag{A}$$

In the formula (A), M1 represents at least one kind among elements selected from group 2 to group 15 except nickel and manganese. X represents at least one kind among group 16 elements and group 17 elements except oxygen. p, q, y and z are values within ranges of $0\leq p\leq 1.5$, $0\leq q\leq 1.0$, $0\leq r\leq 1.0$, $-0.10\leq y\leq 0.20$, and $0\leq z\leq 0.2$.)

$$Li_aM2_bPO_4 \tag{B}$$

In the formula (B), M2 represents at least one kind among elements selected from group 2 to group 15. a and b are values within ranges of $0\leq a\leq 2.0$ and $0.5\leq b\leq 2.0$.

$$Li_fMn_{(1-g-h)}Ni_gM3_hO_{(2-j)}F_k \tag{C}$$

In the formula (C), M3 represents at least one kind selected from the group consisting of cobalt, magnesium (Mg), aluminum, boron (B), titanium (Ti), vanadium (V), chromium (Cr), iron, copper (Cu), zinc (Zn), zirconium (Zr), molybdenum (Mo), tin (Sn), calcium (Ca), strontium (Sr) and tungsten (W). f, g, h, j and k are values within ranges of 0.8≤f≤1.2, 0<g<0.5, 0≤h≤0.5, g+h<1, −0.1≤j≤0.2, and 0≤k≤0.1. The composition of lithium differs depending on the state of charge-discharge and a value of f represents a value in the fully-discharged state.

$$Li_mNi_{(1-n)}M4_nO_{(2-p)}F_q \quad (D)$$

In the formula (D), M4 represents at least one kind selected from the group consisting of cobalt, manganese, magnesium, aluminum, boron, titanium, vanadium, chromium, iron, copper, zinc, molybdenum, tin, calcium, strontium and tungsten. m, n, p and q are values within ranges of 0.8≤m≤1.2, 0.005≤n≤0.5, −0.1≤p≤0.2, and 0≤q≤0.1. The composition of lithium differs depending on the state of charge-discharge and a value of m represents a value in the fully-discharged state.

$$Li_rCo_{(1-s)}M5_sO_{(2-t)}F_u \quad (E)$$

In the formula (E), M5 represents at least one kind selected from the group consisting of nickel, manganese, magnesium, aluminum, boron, titanium, vanadium, chromium, iron, copper, zinc, molybdenum, tin, calcium, strontium and tungsten. r, s, t and u are values within ranges of 0.8≤r≤1.2, 0≤s≤0.5, −0.1≤t≤0.2, and 0≤u≤0.1. The composition of lithium differs depending on the state of charge-discharge and a value of r represents a value in the fully-discharged state.

$$Li_vMn_{2-w}M6_wO_xF_y \quad (F)$$

In the formula (F), M6 represents at least one kind selected from the group consisting of cobalt, nickel, magnesium, aluminum, boron, titanium, vanadium, chromium, iron, copper, zinc, molybdenum, tin, calcium, strontium and tungsten. v, w, x and y are values within ranges of 0.9≤v≤1.1, 0≤w≤0.6, 3.7≤x≤4.1, and 0≤y≤0.1. The composition of lithium differs depending on the state of charge-discharge and a value of v represents a value in the fully-discharged state.

$$Li_zM7PO_4 \quad (G)$$

In the formula (G), M7 represents at least one kind selected from the group consisting of cobalt, manganese, iron, nickel, magnesium, aluminum, boron, titanium, vanadium, niobium (Nb), copper, zinc, molybdenum, calcium, strontium, tungsten and zirconium. z is a value within a range of 0.9≤z≤1.1. The composition of lithium differs depending on the state of charge-discharge and a value of z represents a value in the fully-discharged state.

Other examples of the positive electrode material capable of absorbing and releasing lithium include inorganic compounds containing no lithium such as $MnO_2$, $V_2O_5$, $V_6O_{13}$, NiS, and MoS.

The positive electrode material capable of absorbing and releasing lithium may be those other than described above. In addition, two or more kinds of positive electrode materials exemplified above may be mixed in optional combination.

As the binder, at least one kind is used which is selected from resin materials such as polyvinylidene fluoride (PVdF), polytetrafluoroethylene (PTFE), polyacrylonitrile (PAN), styrene butadiene rubber (SBR) and carboxymethylcellulose (CMC), and copolymers predominantly composed of these resin materials.

Examples of the conductive agent include carbon materials such as graphite, carbon black, and Ketjen black, and one kind or two or more kinds thereof are mixed and used. Besides the carbon materials, a metal material, a conductive polymer material, or the like may be used as long as it has conductivity.

The negative electrode 22 has a structure in which, for example, a negative electrode active material layer 22B is provided on both surfaces of a negative electrode current collector 22A. Although not shown, the negative electrode active material layer 22B may be provided only on one surface of the negative electrode current collector 22A according to an embodiment. The negative electrode current collector 22A includes, for example, a metal foil such as a copper foil, a nickel foil, or a stainless steel foil.

The negative electrode active material layer 22B contains one or more kinds of negative electrode active materials capable of absorbing and releasing lithium. The negative electrode active material layer 22B may further contain an additive such as a binder and a conductive agent, as required.

In this nonaqueous electrolyte battery, it is preferred that the electrochemical equivalent of the negative electrode 22 or the negative electrode active material is larger than the electrochemical equivalent of the positive electrode 21 to theoretically prevent lithium metal from precipitating on the negative electrode 22 during charge.

Examples of the negative electrode active material include carbon materials such as non-graphitizable carbon, easily graphitizable carbon, graphite, pyrolytic carbons, cokes, glassy carbons, organic polymer compound baked body, carbon fiber, and activated carbon. The cokes include pitch coke, needle coke and petroleum coke. The organic polymer compound baked body refers to a substance obtained by baking a polymer material such as a phenol resin or a furan resin at an adequate temperature to carbonize it, and part thereof is classified into non-graphitizable carbon or easily graphitizable carbon. These carbon materials are preferred since changes in crystal structure generated during charge-discharge-are very small, a high charge and discharge capacity can be obtained, and good cycle characteristics can be attained. In particular, graphite is preferred since it has a large electrochemical equivalent and can achieve a high energy density. In addition, non-graphitizable carbon is preferred since excellent cycle characteristics are obtained. Furthermore, those having a low charge-discharge potential, specifically those having a charge-discharge potential close to that of lithium metal, are preferred since they can easily realize a high energy density of the battery.

As another negative electrode active material capable of increasing the capacity, a material containing at least one kind of a metal element and a metalloid element as a constituent element (for example, an alloy, a compound or a mixture) can also be mentioned. The reason for this is that a high energy density can be achieved by using such a material. Particularly, when the negative electrode material is used together with a carbon material, it is more preferred because a high energy density can be achieved and excellent cycle characteristics can be attained. In addition, in the present technology, the alloy includes not only alloys composed of two or more kinds of metal elements but also alloys containing one or more kinds of metal elements and one or more kinds of metalloid elements. Also, the alloy may contain a nonmetallic element. The structure includes a solid solution, a eutectic alloy (eutectic mixture), an intermetallic compound, or two or more kinds of them coexisting.

As such a negative electrode active material, for example, a metal element or a metalloid element capable of forming an alloy with lithium can be mentioned. Specific examples of the metal element or metalloid element include magnesium, boron, aluminum, titanium, gallium (Ga), indium (In), silicon (Si), germanium (Ge), tin, lead (Pb), bismuth (Bi), cadmium (Cd), silver (Ag), zinc, hafnium (Hf), zirconium, yttrium (Y), palladium (Pd) and platinum (Pt). These elements may be crystalline or amorphous.

As the negative electrode active material, a substance containing a metal element or a metalloid element of group 4B in the short-period periodic table as a constituent element is preferred, and the negative electrode active material containing at least one of silicon and tin as a constituent element is more preferred. The reason for this is that silicon and tin have a large ability to absorb and release lithium, and can achieve a high energy density. Examples of such a negative electrode active material include a simple substance, an alloy or a compound of silicon, a simple substance, an alloy or a compound of tin, a material at least partially having one or more phases thereof.

Examples of the alloy of silicon include alloys containing, as a second constituent element other than silicon, at least one of the group consisting of tin, nickel, copper, iron, cobalt, manganese, zinc, indium, silver, titanium, germanium, bismuth, antimony (Sb) and chromium. Examples of the alloy of tin include alloys containing, as a second constituent element other than tin, at least one of the group consisting of silicon, nickel, copper, iron, cobalt, manganese, zinc, indium, silver, titanium, germanium, bismuth, antimony and chromium.

As the compound of tin or the compound of silicon, for example, one containing oxygen or carbon is mentioned, and in addition to tin or silicon, the above-mentioned second constituent element may be contained.

Particularly, the Sn-based negative electrode active material is preferably a SnCoC-containing material in which cobalt, tin, and carbon are contained as constituent elements, the content of carbon is 9.9% by mass or more and 29.7% by mass or less, and the ratio of cobalt to the total of tin and cobalt is 30% by mass or more and 70% by mass or less. The reason for this is that a high energy density can be achieved in such a composition range and excellent cycle characteristics can be attained.

The SnCoC-containing material may further contain other constituent elements as necessary. As the other constituent elements, for example, silicon, iron, nickel, chromium, indium, niobium, germanium, titanium, molybdenum, aluminum, phosphorus (P), gallium and bismuth are preferred, and two or more kinds thereof may be contained. The reason for this is that the capacity or cycle characteristics can be further improved.

In addition, the SnCoC-containing material has a phase containing tin, cobalt, and carbon, and the phase preferably has a low crystalline or amorphous structure. Further, in the SnCoC-containing material, it is preferred that at least a part of carbon as the constituent element is bonded to a metal element or a metalloid element which is another constituent element. The reason for this is that deterioration of cycle characteristics is thought to be due to aggregation or crystallization of tin and the like, and such aggregation or crystallization can be suppressed when carbon is bonded to other elements.

As a measurement method for examining a bonding state of an element, for example, an X-ray photoelectron spectroscopy (XPS) is mentioned. In XPS, in the case of graphite, a peak of the 1s orbit (C1s) of carbon appears at 284.5 eV in a device calibrated in energy in such a way that a peak of the 4f orbital (Au4f) of the gold atom is obtained at 84.0 eV. Also, if it is surface contaminated carbon, it appears at 284.8 eV. In contrast, when the charge density of the carbon element increases, for example, when carbon is bonded to a metal element or a metalloid element, the peak of C1s appears in a region lower than 284.5 eV. That is, when a peak of a combined wave of C1s obtained for the SnCoC-containing material appears in a region lower than 284.5 eV, at least a part of the carbon contained in the SnCoC-containing material is bonded to a metal element or a metalloid element which is another constituent element.

In the XPS measurement, for example, the peak of C1s is used for correction of an energy axis of the spectrum. Normally, since surface contaminated carbon is present on the surface, the peak of C1s of surface contaminated carbon is set to 284.8 eV, which is taken as the energy reference. In the XPS measurement, the waveform of the peak of C1s is obtained in a form including the peak of the surface contaminated carbon and the peak of the carbon in the SnCoC-containing material. Therefore, by analysis using, for example, commercially available software, surface contaminated carbon peak is separated from the carbon peak in the SnCoC-containing material. In the analysis of the waveform, a position of a main peak present on the lowest bound energy side is defined as the energy reference (284.8 eV).

In addition, as another negative electrode active material, for example, a metal oxide or a polymer compound capable of absorbing and releasing lithium, or the like can also be mentioned. Examples of the metal oxide include lithium titanium oxide containing titanium and lithium such as lithium titanate ($Li_4Ti_5O_{12}$), iron oxide, ruthenium oxide, molybdenum oxide, and the like. Examples of the polymer compound include polyacetylene, polyaniline, polypyrrole, and the like.

As the binder, at least one kind is used which is selected from resin materials such as polyvinylidene fluoride, polytetrafluoroethylene, polyacrylonitrile, styrene butadiene rubber and carboxymethylcellulose (CMC), and copolymers predominantly composed of these resin materials. As the conductive agent, the same carbon material as the positive electrode active material layer 21B or the like can be used.

The separator 23 separates the positive electrode 21 and the negative electrode 22, and allows lithium ions to pass while preventing a short circuit of the current caused by contact between both electrodes. The separator 23 is composed of, for example, a porous membrane made of a resin including polytetrafluoroethylene, polypropylene, polyethylene or the like, and the separator 23 may have a structure formed by laminating two or more of these porous membranes. Among these membranes, a polyolefin porous membrane is preferred since it is excellent in the effect of preventing a short circuit and can improve battery safety by a shutdown effect. In particular, polyethylene is preferred as a material constituting the separator 23 since polyethylene can achieve a shutdown effect in a range of 100° C. or higher and 160° C. or lower, and is also excellent in electrochemical stability. In addition, a material obtained by copolymerizing or blending a resin having chemical stability with polyethylene or polypropylene can be used. Alternatively, the porous membrane may have a structure of three or more layers in which a polypropylene layer, a polyethylene layer, and a polypropylene layer are sequentially laminated.

Further, in the separator 23, a resin layer may be provided on one surface or both surfaces of the porous membrane which is a base material. The resin layer is a porous matrix resin layer on which an inorganic substance is carried. Thereby, oxidation resistance can be attained and deterioration of the separator 23 can be suppressed. As the matrix resin, for example, polyvinylidene fluoride, hexafluoropropylene (HFP), polytetrafluoroethylene or the like can be used, and copolymers thereof can also be used.

As the inorganic substance, a metal, a semiconductor, oxides or nitrides thereof can be mentioned. For example, aluminum, titanium, and the like can be mentioned as the metal, and silicon, boron and the like can be mentioned as the semiconductor. As the inorganic substance, those having substantially no conductivity and a large heat capacity are preferred. The reason for this is that when the heat capacity is large, it is useful as a heat sink at the time of current heat generation and it becomes possible to further suppress thermal runaway of the battery. Examples of such inorganic substances include oxides or nitride such as alumina ($Al_2O_3$), boehmite (monohydrate of alumina), talc, boron nitride (BN), aluminum nitride (AlN), titanium dioxide ($TiO_2$), and silicon oxide ($SiOx$).

A particle diameter of the inorganic substance is preferably in the range of 1 nm to 10 μm. When the particle diameter is smaller than 1 nm, it is difficult to obtain and even if it is available, it is not suitable for cost. The reason for this is that when the particle diameter is larger than 10 μm, a distance between the electrodes becomes large, and therefore a sufficient amount of active material to be charged cannot be sufficiently obtained in a limited space and the battery capacity becomes low.

As a method of forming the resin layer, for example, a method may be employed in which a slurry composed of a matrix resin, a solvent and an inorganic material is applied onto a base material (porous membrane), phase-separated by making it pass through a poor solvent of the matrix resin and a solvent affinity bath of the above solvent, and then dried.

The piercing strength of the separator 23 is preferably in the range of 100 gf to 1000 gf. It is more preferably 100 gf to 480 gf. The reason for this is that when the piercing strength is low, a short circuit may occur, and when the piercing strength is high, ionic conductivity decreases.

An air permeability of the separator 23 is preferably in the range of 30 sec/100 cc to 1000 sec/100 cc. It is more preferably 30 sec/100 cc to 680 sec/100 cc. The reason for this is that when the air permeability is low, a short circuit may occur, and when the air permeability is high, ionic conductivity decreases.

In addition, the above-mentioned inorganic substance may be contained in the porous membrane as the base material.

The separator 23 is impregnated with an electrolytic solution which is a liquid electrolyte. The electrolytic solution contains a solvent and an electrolyte salt dissolved in the solvent. In order to improve battery characteristics, the electrolytic solution may contain publicly known additives.

As the solvent, a cyclic carbonate ester such as ethylene carbonate or propylene carbonate can be used, and it is preferred to use one of ethylene carbonate and propylene carbonate, particularly, a mixture thereof. The reason for this is that cycle characteristics can be improved.

As the solvent, it is preferred to use a mixture of chain carbonate esters such as diethyl carbonate, dimethyl carbonate, ethyl methyl carbonate and methyl propyl carbonate, in addition to these cyclic carbonate esters. The reason for this is that high ionic conductivity can be achieved.

The solvent preferably further contains 2,4-difluoroanisole or vinylene carbonate. The reason for this is that 2,4-difluoroanisole can improve discharge capacity and vinylene carbonate can improve cycle characteristics. Therefore, when these materials are mixed and used, it is preferred because discharge capacity and cycle characteristics can be improved.

Examples of the solvent other than these solvents include butylene carbonate, γ-butyrolactone, γ-valerolactone, 1,2-dimethoxyethane, tetrahydrofuran, 2-methyltetrahydrofuran, 1,3-dioxolane, 4-methyl-1,3-dioxolane, methyl acetate, methyl propionate, acetonitrile, glutaronitrile, adiponitrile, methoxyacetonitrile, 3-methoxypropionitrile, N,N-dimethylformamide, N-methylpyrrolidinone, N-methyloxazolidinone, N,N-dimethylimidazolidinone, nitromethane, nitroethane, sulfolane, dimethylsulfoxide, and trimethyl phosphate.

In addition, a compound in which at least a part of hydrogen of these nonaqueous solvents is substituted with fluorine may be preferred since it may improve the reversibility of an electrode reaction depending on the kinds of electrodes to be combined.

The electrolyte salt includes, for example, lithium salts, and lithium salts may be used alone, or may be used as a mixture of two or more thereof. Examples of the lithium salt include $LiPF_6$, $LiBF_4$, $LiAsF_6$, $LiClO_4$, $LiB(C_6H_5)_4$, $LiCH_3SO_3$, $LiCF_3SO_3$, $LiN(SO_2CF_3)_2$, $LiC(SO_2CF_3)_3$, $LiAlCl_4$, $LiSiF_6$, LiCl, lithium difluoro[oxolato-O,O']borate, lithium bis(oxalate)borate, and LiBr. Among them, $LiPF_6$ is preferred since it can achieve high ionic conductivity and can improve cycle characteristics.

The nonaqueous electrolyte battery may be designed such that an open circuit voltage at the time of full charge (that is, a battery voltage) is, for example, within the range of 2.80 V to 6.00 V or 3.60 V to 6.00 V, preferably 4.25 V to 6.00 V or 4.20 V to 4.50 V, and more preferably 4.30 V to 4.55 V. When the open circuit voltage at the time of complete charge is, for example, set to 4.25 V or more in a battery using layered rock salt type lithium composite oxide or the like as the positive electrode active material, the amount of lithium released per unit mass increases as compared with the 4.20 V battery even in the same positive electrode active material, and therefore the amounts of the positive electrode active material and the negative electrode active material are adjusted correspondingly to obtain high energy density.

When the nonaqueous electrolyte secondary battery having the above configuration is charged, for example, lithium ions are released from the positive electrode active material layer 21B and absorbed in the negative electrode active material layer 22B via the electrolytic solution. Further, when the battery is discharged, for example, lithium ions are released from the negative electrode active material layer 22B and absorbed in the positive electrode active material layer 21B via the electrolytic solution.

Various analysis methods have been proposed as a general condition analysis method of the secondary battery as described above. These condition analysis methods are broadly divided into two, a destructive method involving battery disassembly and a non-destructive method. A representative example of the non-destructive method is an AC impedance method (EIS: Electrochemical Impedance Spectroscopy). In general, physical phenomena inside batteries are very complicated, and it is not easy to separate different physical processes in interpreting EIS results. An equivalent circuit analysis can be mentioned as a method of information separation at that time. In this analysis, EIS data is treated as behavior of AC circuit in which various elements are combined and parameters of circuit elements such as resistance value are determined by a fitting. However, since this method uses a finite number of circuit elements, resolution of information is limited, and arbitrariness and stability of fitting result are problematic on how to assume the type of equivalent circuit to be used.

On the other hand, there is a DRT (Distribution of Relaxation Times (relaxation time distribution)) method as an analysis means for avoiding the difficulty of the equivalent circuit analysis and enhancing information separability. This transforms the frequency domain showing an arcuate shape on a Nyquist diagram of impedance into a continuous function of a relaxation time, more information than the equivalent circuit analysis consisting of a small number of discrete parameters is obtained, and consequently high precision information separation can be performed. Also, there is little arbitrariness as to what circuit elements to assume and how many circuit elements to assume. On the other hand, when phenomena such as battery degradation are extremely complicated, association with physical phenomena may not always be unique even if only the distribution of relaxation times (relaxation time distribution) method is used. An embodiment of the present technology made in view of the above points will be described in more detail.

Figure 3:
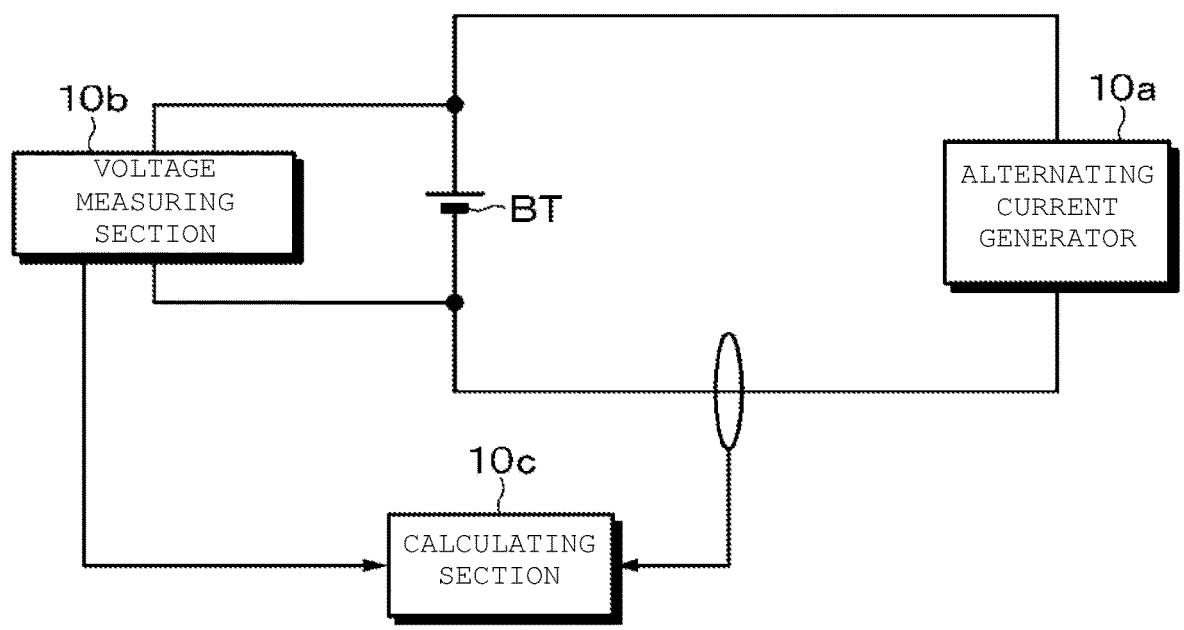
FIG. 3 is a diagram illustrating a configuration example of an analytical device according to an embodiment of the present technology.

A configuration example of an analytical device that detects a state or a state change of the constituent members of the above-described lithium ion secondary battery will be described. The analytical device includes a battery condition analysis section (battery condition analysis section 10). FIG. 3 shows a configuration example of the battery condition analysis section 10. The battery condition analysis section 10 includes an alternating current generation section 10a, a voltage measuring section 10b, and a calculating section 10c. The unit of the battery BT to be analyzed can be optionally set, such as a single cell, a submodule, or the like.

The alternating current generation section 10a includes, for example, an AC constant current source. The AC constant current source of the alternating current generation section 10a generates an alternating current (AC constant current) with a constant amplitude at the frequency f specified by the calculating section 10c and supplies it to the battery BT. The alternating current supplied to the battery BT is detected by a current detecting section (not shown), and a detection result is supplied to the calculating section 10c.

The voltage measuring section 10b detects an AC voltage generated between both ends of the battery BT in response to the supply of the AC current and supplies the detection result to the calculating section 10c.

The calculating section 10c samples a current value supplied from the current detecting section at sampling intervals previously specified to obtain current waveform data. Further, voltage waveform data is obtained by sampling the voltage value supplied from the voltage measuring section 10b at a predetermined sampling period (for example, the same period as the current detection sampling period and synchronized period).

Then, the calculating section 10c acquires the current waveform data and the voltage waveform data, for example, one cycle at a time, and stores the current waveform data and the voltage waveform data in a storage part (not shown) as appropriate. Subsequently, the calculating section 10c calculates the impedance Z (the real number component and the imaginary number component of the impedance Z) for the battery BT at the specified frequency f based on the current waveform data and the voltage waveform data. Subsequently, the calculating section 10c sets the real number component of the impedance Z at each frequency f as the horizontal axis coordinate value on the coordinate plane (complex plane) having the real number component on the horizontal axis and the imaginary number component on the vertical axis, plotting the point having the imaginary component value of the impedance Z as the vertical axis coordinate value, thereby creating a Nyquist diagram. Distribution of relaxation times (DRT) in the frequency domain appearing in an arc shape in this Nyquist diagram is calculated and the state or state change of the battery BT is detected from the calculation result. Here, the state change of the battery BT is, for example, deterioration of the constituent members of the battery BT, and the state of the battery BT is, for example, the state of the coating of the electrode of the battery BT. The constituent members of the battery BT are, for example, the positive electrode 21 as the first constituent member and the negative electrode 22 as the second constituent member. The detection result is notified to the user via an appropriate notifying part such as display or voice.

As a method for measuring the AC impedance, any method may be used as long as the impedance change with respect to frequency can be measured about 10 points per single digit of frequency. In particular, it is preferred to use a frequency response analyzer (FRA). When there is a frequency region that does not show an arc shape on the Nyquist diagram such as the inductive component or the Warburg component, it is necessary to exclude the data of that area in some way before DRT calculation. Simple data deletion may be used as an exclusion method, but it is more preferred that precision is made using extrapolation method or fitting to an equivalent circuit.

As a calculation method of DRT, any publicly known method can be used. Specifically, a method of using Fourier transform and window function processing together, a regularization method, or the like are used. In either case, it is necessary to select appropriate calculation parameters so as not to generate vibrational noise or loss of peak shape in the DRT result.

It was found that when the relaxation time distribution in the frequency domain expressed in a circular arc shape on the Nyquist diagram obtained by the AC impedance method is determined, there is a correlation between the peak or peak change of the DRT in the predetermined frequency band and the state or state change of the constituent member of the battery BT, and according to the peak or peak change of the DRT, it is possible to identify which constituent member of the battery BT corresponds the change and to detect the state or state change of the constituent member.

For example, it was found that when the DRT in an initial state is compared with the DRT after the predetermined cycle, and, for example, the peak of the DRT in the first frequency band: 1 to 10 Hz has changed by a predetermined value or more, the positive electrode 21 can be judged to be deteriorated. Also, it was found that when the DRT in an initial state is compared with the DRT after the predetermined cycle, and, for example, the peak of the DRT in the second frequency band: 10 to 100 Hz has changed by a predetermined value or more, the negative electrode 22 can be judged to be deteriorated.

Also, it was found that, for example, when the peak of the DRT at 1 to 10 Hz is not within the prescribed range, an amount of a coating (coating amount) of the positive electrode 21 can be judged to be not appropriate. Further, it was found that, for example, when the peak of DRT at 10 to 100 Hz is not within the prescribed range, the coating amount of the negative electrode 22 can be judged to be not appropriate. In addition, the above-mentioned frequency band can vary depending on the temperature, and in this example it is the value of the frequency at normal temperature (23° C.).

Figure 4:
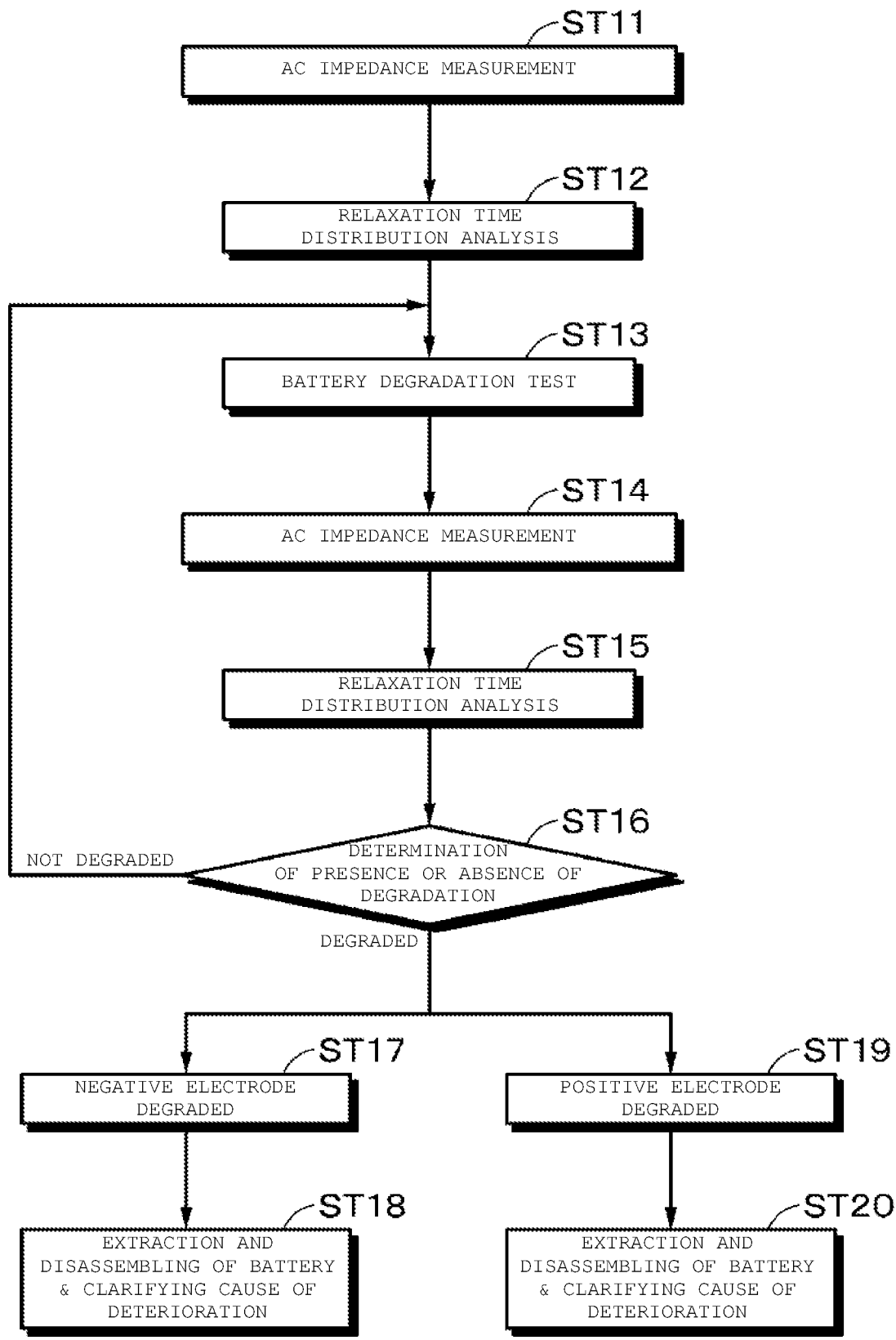
FIG. 4 is a flowchart for explaining a process example of a battery degradation analysis test according to an embodiment.

Next, an operation example of the analytical device will be described by taking as an example a plurality of steps to which the analytical device is applicable. FIG. 4 is a flowchart for explaining a step example of a battery degradation analysis test in a factory (before shipment).

First, prior to the battery degradation test, processing of measuring an AC impedance is performed for the battery BT, and a relaxation time distribution in the frequency domain appearing in an arc shape on the Nyquist diagram obtained as a result is acquired (steps ST11 and ST12).

Next, a battery degradation test is performed in which the battery BT is charged and discharged in a predetermined number of cycles (step ST13). Subsequently, the AC impedance measurement for the battery BT after the battery degradation test is performed, and the relaxation time distribution in the frequency domain appearing in an arc shape on the Nyquist diagram obtained as a result is acquired (steps ST14, ST15).

Next, the presence or absence of degradation of the battery BT is determined (step ST16). For example, it is judged whether the peak change of DRT before and after the battery degradation test at 1 to 10 Hz and the peak change of DRT before and after the battery deterioration test at 10 to 100 Hz are equal to or more than a predetermined value. It should be noted that these two determinations may be sequentially performed in chronological order, or may be performed in parallel.

For example, when the DRT peak at 1 to 10 Hz has changed by a predetermined value or more before and after the battery degradation test, in other words, when the resistance change of the positive electrode 21 is not less than a certain value, it is determined that the positive electrode 21 is deteriorated (step ST17). In this case, an inspector or the like extracts the battery BT in a lot, disassembles it, and analyzes it to perform processing of clarifying the cause of deterioration and the like (step ST18). Further, when the peak of the DRT at 10 to 100 Hz changes by a predetermined value or more before and after the battery degradation test, in other words, when the resistance change of the negative electrode 22 is not less than a certain value, it is determined that the negative electrode 22 is deteriorated (Step ST19). In this case, the inspector or the like extracts the battery BT of the above lot and disassembles it and analyzes a predetermined member, thereby performing processing of clarifying the cause of deterioration and the like (step ST20). When it is determined that neither the positive electrode 21 nor the negative electrode 22 is deteriorated, the processing returns to step ST13 and the battery degradation test is performed again. When it is determined that both of the positive electrode 21 and the negative electrode 22 are deteriorated, processing of clarifying the cause of deterioration or the like is performed without branching the processing. In this way, since it is possible to predict in advance which part of the plurality of batteries BT is deteriorated based on the change in the peak of the DRT before and after the battery deterioration test, the degradation analysis of the battery can be performed efficiently and accurately.

Figure 5:
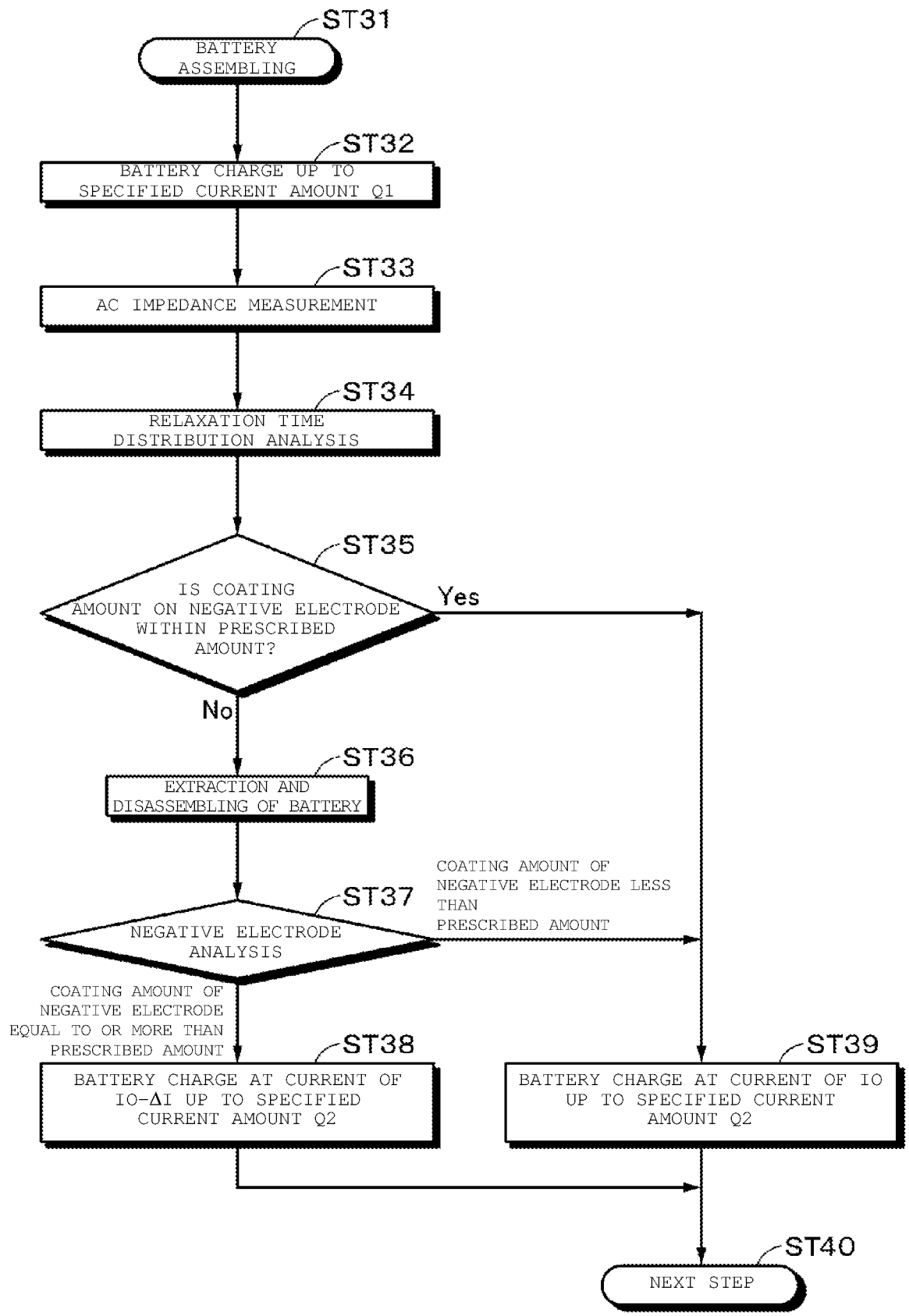
FIG. 5 is a flowchart for explaining a process example of an initial charging step according to an embodiment.

In addition, the analytical device can also be applied to steps different from the battery degradation analysis test. FIG. 5 is a flowchart for explaining an initial charging step in a battery manufacturing process in a factory (before shipment), for example. The battery BT is assembled (step ST31), and processing of charging the assembled battery BT up to a preset current amount Q1 is performed (step ST32). Subsequently, processing of measuring an AC impedance for the battery BT is performed, and the relaxation time distribution in the frequency domain appearing in an arc shape on the Nyquist diagram obtained as a result is acquired (steps ST33 and ST34).

Next, it is determined whether or not an amount of a coating formed on the negative electrode 22 in the battery BT is within a prescribed range (prescribed amount) (step ST35). For example, it is judged whether or not the peak of DRT at 10 to 100 Hz obtained by relaxation time distribution analysis is within the prescribed range. Here, the amount of a coating formed on the negative electrode 22 is within a prescribed range, an initial charge processing is performed in which the battery BT is charged up to the current amount Q2 previously designated at the current I0 (step ST39) and the processing proceeds on to a next step (step ST40).

When the DRT is not within the prescribed range, it is determined that the state of the coating formation of the negative electrode 22 is not appropriate. In this case, processing is performed in which the battery BT in the lot is extracted and disassembled, and the negative electrode 22 is actually analyzed (step ST36). As a result of the analysis, if an amount of a coating of the negative electrode 22 is less than the prescribed amount, an initial charge processing is performed to charge the battery BT of the lot up to the current amount Q2 previously designated at a current I0 (step ST39) and the processing proceeds on to a next step (step ST40). If the amount of a coating of the negative electrode 22 is equal to or more than the prescribed amount, an initial processing is performed to charge the battery up to the current amount Q2 at a current value lower by ΔI than the current I0 in order to maintain the quality of the battery of the lot (step ST38) and the processing proceeds on to a next step (step ST40). In this way, it is possible to avoid deterioration in quality due to excessive current value in the initial charging step with respect to the state of the coating of the negative electrode 22. In the flowchart shown in FIG. 5, the processing of steps ST33 to ST35 is performed by the battery condition analysis section 10.

Steps ST36 and ST37 are carried out in order to examine the formation state of the coating of the negative electrode 22 in detail, and it is possible to omit it. In this case, the processing in step ST35 is processing of determining whether or not the amount of a coating formed on the negative electrode 22 is a prescribed range (prescribed amount) or more. When the amount of a coating is less than or equal to (or less than) the prescribed range, charging at a normal current I0 is executed, and when it exceeds (or equal to or more than) the prescribed range, it is judged that the coating amount exceeds the prescribed amount and charging at lower current value I0-ΔI is executed.

Figure 6:
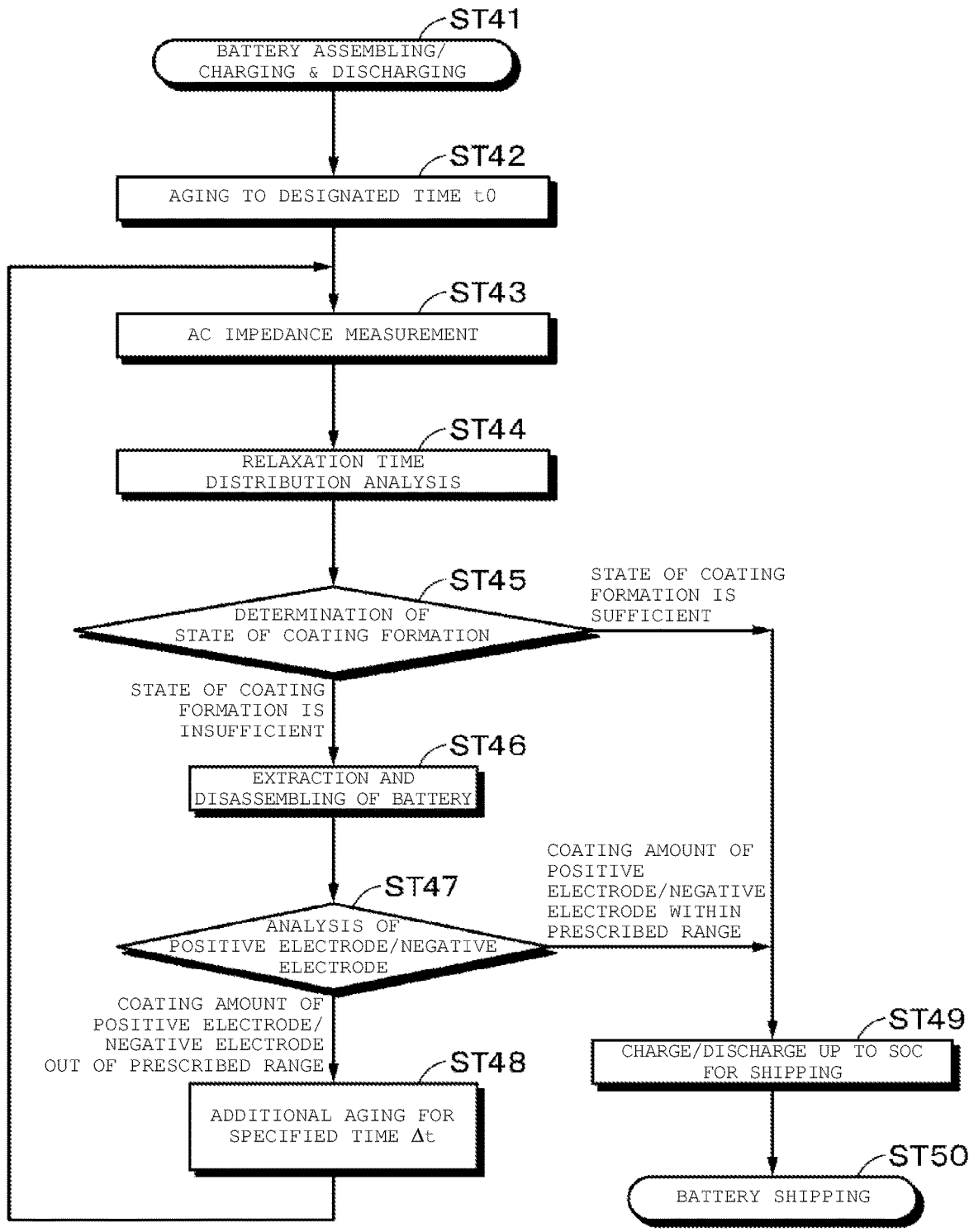
FIG. 6 is a flowchart for explaining a process example of an aging step according to an embodiment.

FIG. 6 is a flowchart for explaining a pre-shipment aging step of the battery BT in a battery manufacturing process in a factory (before shipment). Processing of aging the battery BT that has undergone the assembling/charging & discharging steps by a previously designated time t0 is performed (steps ST41 and ST42). Subsequently, processing of measuring an AC impedance for the battery BT is performed, and the relaxation time distribution in the frequency domain appearing in an arc shape on the Nyquist diagram obtained as a result is acquired (steps ST43 and ST44).

Next, the state of coating formation of the positive electrode 21 and the negative electrode 22 is determined (step ST45). For example, it is judged whether or not the peak of DRT at 1 to 10 Hz and the peak of DRT at 10 to 100 Hz are equal to or more than the prescribed range. When the peak of DRT is within the prescribed range, it is determined that the formation of the coating of the positive electrode 21 and the negative electrode 22 is in a sufficient state, and charging and discharging are performed up to the specified state of charge (SOC) for shipping the battery BT (step ST49), and the battery is shipped (step ST50).

When at least one of the peak of DRT at 1 to 10 Hz and the peak of DRT at 10 to 100 Hz does not satisfy the prescribed range, it is judged that the coating formation of at least one of the positive electrode 21 and the negative electrode 22 is insufficient. In this case, processing of extracting and disassembling the battery BT in the lot is performed (step ST46), and processing of actually analyzing the positive electrode 21 and the negative electrode 22 is performed (step ST47). As a result of the analysis, if the coating amounts of the positive electrode 21 and the negative electrode 22 are within the prescribed range, the above-mentioned processing of step ST49 and step ST50 is performed.

As a result of analysis, when the coating amount of the positive electrode 21 and the negative electrode 22 is out of the prescribed range (insufficient), an additional aging processing with a designated time Δt is performed for improving the quality of the battery (step ST48). Thereafter, processing of measuring an AC impedance and the processing of obtaining the relaxation time distribution (steps ST43 and 44) are performed again, and the same processing is performed. In this way, it is possible to ensure the quality level of the battery products to be shipped. In the flowchart shown in FIG. 7, the processing in steps ST43 to ST45 is performed by the battery condition analysis section 10.

Steps ST46 and ST47 are carried out when investigating the formation state of the coating of the positive electrode 21 and the negative electrode 22 in detail, and it is possible to omit them. In this case, the processing in step ST45 is processing of determining whether or not the amount of a coating formed on the positive electrode 21 and the negative electrode 22 is a prescribed range (prescribed amount) or more. When the amount of a coating is equal to or more than the prescribed range, it is judged that the formation state of the coating is sufficient, and charging and discharging are performed up to the state of charge (SOC) for shipping, and when the amount of a coating is less than the prescribed range, it is judged that the formation state of the coating is insufficient, and additional aging is executed.

Although a publicly known technique can be used as the electrode analysis technique in the above-mentioned processing, since the impedance of the battery is greatly affected by the interface behavior between the electrode and the electrolyte layer, it is preferred to use the surface/interface analysis technique. Specific examples of such techniques include X-ray photoelectron spectroscopy, Auger electron spectroscopy, electron microscopy, secondary ion mass spectrometry, glow discharge optical emission spectrometry, infrared spectroscopy, Raman spectroscopy, scanning probe microscopy, X-ray absorptiometry, X-ray spectroscopy and the like can be used.

Figure 7:
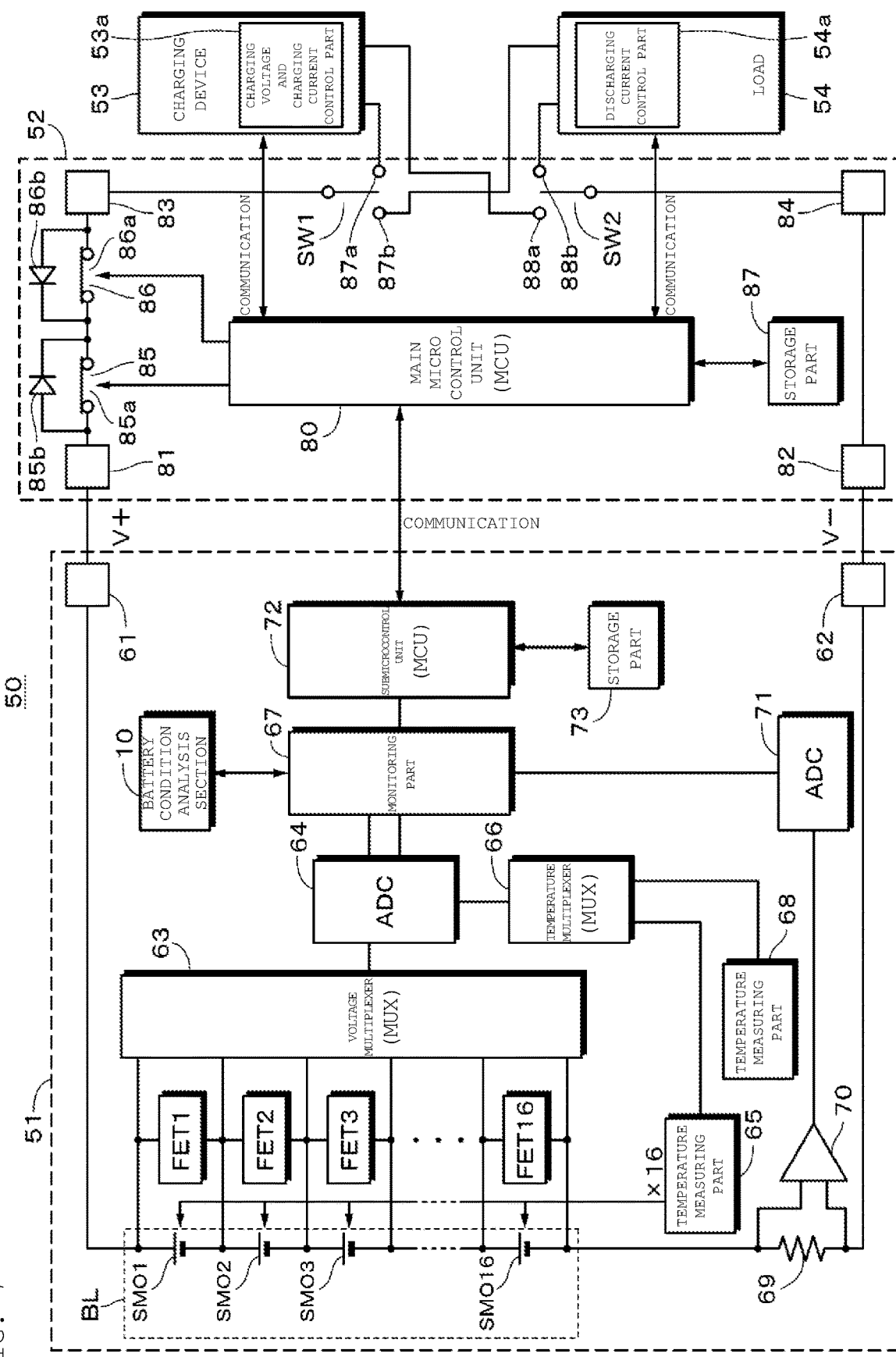
FIG. 7 is a view illustrating a configuration example of an electric storage system according to an embodiment of the present technology.

The battery condition analysis section 10 can also be applied to an electric storage device. FIG. 7 is a view showing a configuration example of an electric storage system to which such an electric storage device is applied. The electric storage system 50 has a configuration including an electric storage device (hereinafter, appropriately referred to as an electric storage module) 51 and a controller 52. Transmission of electric power and communication are performed between the electric storage module 51 and the controller 52. Although only one electric storage module is shown in FIG. 7, a plurality of electric storage modules may be connected and each electric storage module may be connected to the controller 52 according to an embodiment.

The controller 52 including a processor is connected to a charging device (charging power source) 53 or a load 54 via a power cable and a communication bus. When charging the electric storage module 51, the controller 52 is connected to a charging device 53. The charging device 53 has a DC (Direct Current)-DC converter and has at least a charging voltage and charging current control part 53*a*. The charging voltage and charging current control part 53*a*, for example, sets a charging voltage and a charging current to predetermined values according to the control of the controller 52.

When discharging the electric storage module 51, the controller 52 is connected to the load 54. Electric power of the electric storage module 51 is supplied to the load 54 via the controller 52. The load 54 connected to the controller 52 is a motor system inverter circuit in an electric vehicle, a household electric power system, or the like.

The load 54 includes at least a discharging current control part 54*a*. The discharging current control part 54*a*, for example, sets a discharging current to a predetermined value according to the control by a main micro control unit 80 of the controller 52. For example, the load 54 appropriately controls the magnitude of the discharge current (load current) flowing through the electric storage module 51 by making the load resistance variable.

A configuration example of the electric storage module 51 according to an embodiment will be described. For example, each part constituting the electric storage module 51 is housed in an outer case having a predetermined shape. It is desirable to use a material having high conductivity and emissivity for the outer case. By using the material having high conductivity and emissivity, excellent heat dissipation in the outer case can be achieved. By achieving excellent heat dissipation properties, it is possible to suppress temperature rise in the outer case. Furthermore, it is possible to minimize or eliminate the opening of the outer case, thus realizing high dust-proofness and drip drip-proofness. For the outer case, for example, a material such as aluminum or an aluminum alloy, copper, or a copper alloy is used.

The electric storage module 51 has a configuration including, for example, a positive electrode terminal 61, a negative electrode terminal 62, an electric storage block BL which is an electric storage part, an FET (Field Effect Transistor), a voltage multiplexer 63, an ADC (Analog to Digital Converter) 64, a temperature measuring part 65, a temperature multiplexer 66, a monitoring part 67, a temperature measuring part 68, a current sensing resistor 69, a current-sense amplifier 70, an ADC 71, a submicro control unit (MCU) 72, a storage part 73, and a battery condition analysis section 10. A configuration different from the exemplified configuration may be added to the electric storage module 51. For example, a regulator may be added to generate a voltage for operating each part of the electric storage module 51 from the voltage of the electric storage block BL.

The electric storage block BL is formed by connecting one or a plurality of submodules SMO. As an example, the electric storage block BL is configured by serially connecting 16 submodules SMO1, submodules SMO2, submodules SMO3, submodules SMO4, . . . , and submodules SMO16. When it is unnecessary to distinguish between individual submodules, they are appropriately referred to as submodule SMO.

By connecting a plurality of batteries (single cells), a submodule SMO is formed. The submodule SMO has a configuration including, for example, an assembled battery in which eight cells are connected in parallel. For example, when a lithium ion secondary battery described later is used as the cell, the capacity of the submodule SMO is, for example, about 24 Ah, and the voltage is about 3.0 V which is approximately the same as the voltage of the cell, for example.

By connecting a plurality of submodules SMO, the electric storage block BL is formed. The electric storage block BL has, for example, a configuration in which sixteen submodules SMO are connected in series. In this case, the capacity is about 24 Ah and the voltage is about 48 V (3.0 V·16). It should be understood that the number of cells constituting the submodule SMO and the manner of cell connection can be changed as appropriate. Furthermore, the number of the submodules SMO constituting the electric storage block BL and the manner of connection of the submodules SMO can be appropriately changed. Discharge and charge may be performed in units of the electricity storage blocks BL, and discharge and charging may be performed in units of submodules or cells.

A positive electrode side of the submodule SMO1 is connected to the positive electrode terminal 61 of the electric storage module 51. A negative electrode side of the submodule SMO16 is connected to the negative electrode terminal 62 of the electric storage module 51. The positive electrode terminal 61 is connected to a positive electrode terminal of the controller 52. The negative electrode terminal 62 is connected to a negative electrode terminal of the controller 52.

16 FETs (FET1, FET2, FET3, FET4 . . . FET16) are provided between the terminals of the submodule SMO corresponding to the configuration of the 16 submodules SMO. The FET, for example, is for performing a passive cell balance control.

The outline of the cell balance control performed by the FET will be described. For example, assume that deterioration of the submodule SMO2 more advances than the other submodules SMO and the internal impedance of the submodule SMO2 increases. When charging the electric storage module 51 in such a state, the submodule SMO2 is not charged to a normal voltage due to an increase in the internal impedance. For this reason, the balance of the voltage between the submodules SMO varies.

In order to resolve the disturbance in the balance of a voltage between the submodules SMO, the FETs other than the FET2 are turned on, and the submodules SMO other than the submodule SMO2 are discharged to a predetermined voltage value. After the discharge, the FETs are turned off. After the discharge, the voltage of each submodule SMO becomes, for example, a predetermined value (for example, 3.0 V, and the voltage is balanced between the submodules SMO. In addition, the cell balance control method is not limited to the passive method, and so-called active methods and other publicly known methods can be applied.

The voltage between the terminals of the submodule SMO is detected by a voltage detection part (illustration is omitted). The voltage between the terminals of the submodule SMO is detected, for example, during charging and discharging. At the time of discharging of the electric storage module 51, the voltage of each submodule SMO is detected by the voltage detection part at intervals of 250 ms (milliseconds), for example.

The voltage (analog voltage data) of each submodule SMO detected by the voltage detection part is supplied to a voltage multiplexer (MUX (multiplexer)) 63. In this example, since the electric storage block is composed of 16 submodules SMO, 16 analog voltage data are supplied to the voltage multiplexer 63.

The voltage multiplexer 63, for example, switches the channel at predetermined intervals and selects one analog voltage data from 16 analog voltage data. One analog voltage data selected by the voltage multiplexer 63 is supplied to the ADC 64. Then, the voltage multiplexer 63 switches the channel and supplies the next analog voltage data to the ADC 64. That is, at predetermined intervals, 16 analog voltage data are supplied from the voltage multiplexer 63 to the ADC 64.

Switching of channels in the voltage multiplexer 63 is performed according to control by the submicro control unit 72 of the electric storage module 51 or the main micro control unit 80 of the controller 52.

The temperature measuring part 65 detects a temperature of each submodule SMO. The temperature measuring part 65 is composed of elements for detecting the temperature of a thermistor or the like. The temperature of the submodule SMO is detected at predetermined intervals, for example, during charging and discharging. Since the temperature of the submodule SMO and the temperature of the cell constituting the submodule SMO are not largely different from each other, in one embodiment, the temperature of the submodule SMO is measured. The temperature of each of the eight cells may be measured, or the average value of the temperatures of the eight cells may be used as the temperature of the submodule SMO.

Analog temperature data indicating the temperature of each submodule SMO detected by the temperature measuring part 65 is supplied to a temperature multiplexer (MUX) 26. In this example, since the electric storage block BL is composed of 16 submodules SMO, 16 analog temperature data are supplied to the temperature multiplexer 66.

The temperature multiplexer 66, for example, switches the channel at predetermined intervals and selects one analog temperature data from 16 analog temperature data. One analog temperature data selected by the temperature multiplexer 66 is supplied to the ADC 64. Then, the temperature multiplexer 66 switches the channel and supplies the next analog temperature data to the ADC 64. That is, at predetermined intervals, 16 analog temperature data are supplied from the temperature multiplexer 66 to the ADC 64.

Switching of channels in the temperature multiplexer 66 is performed in accordance with control by the submicro control unit 72 of the electric storage module 51 or the main micro control unit 80 of the controller 52.

The ADC 64 converts the analog voltage data supplied from the voltage multiplexer 63 into digital voltage data. The ADC 64 converts the analog voltage data into digital voltage data of, for example, 14 to 18 bits. For a conversion method in the ADC 64, various methods such as the successive approximation method and the $\Delta\Sigma$ (delta sigma) method can be applied.

The ADC 64 includes, for example, an input terminal, an output terminal, a control signal input terminal to which a control signal is input, and a clock pulse input terminal to which a clock pulse is input (these terminals are not shown). Analog voltage data is input to the input terminal. From the output terminal, the converted digital voltage data is output.

To the control signal input terminal, for example, a control signal (control command) supplied from the controller 52 is input. The control signal is, for example, an acquisition instruction signal instructing acquisition of analog voltage data supplied from the voltage multiplexer 63. When the acquisition instruction signal is input, analog voltage data is acquired by the ADC 64, and the acquired analog voltage data is converted into digital voltage data. Then, the digital voltage data is output via the output terminal according to the synchronization clock pulse input to the clock pulse input terminal. The output digital voltage data is supplied to the monitoring part 67.

Further, an acquisition instruction signal instructing acquisition of analog temperature data supplied from the temperature multiplexer 66 is input to the control signal input terminal. According to the acquisition instruction signal, the ADC 64 acquires the analog temperature data. The acquired analog temperature data is converted into digital temperature data by the ADC 64. The analog temperature data is converted into digital temperature data of, for example, 14 to 18 bits. The converted digital temperature data is output via the output terminal, and the output digital temperature data is supplied to the monitoring part 67. In addition, ADCs for processing voltage data and temperature data may be separately provided. A function block of the ADC 64 may have a function of a comparator for comparing the voltage and the temperature with a predetermined value.

For example, 16 digital voltage data and 16 digital temperature data are time-division multiplexed and transmitted from the ADC 64 to the monitoring part 67. An identifier for identifying the submodule SMO may be described in the header of transmission data to indicate which submodule SMO the voltage or temperature belongs to. In this example, the digital voltage data of each submodule SMO obtained at predetermined intervals and converted into digital data by the ADC 64 corresponds to the voltage information. The analog voltage data may be used as the voltage information and the digital voltage data subjected to the correction processing or the like may be used as the voltage information.

The temperature measuring part 68 measures the temperature of the entire electric storage module 51. The temperature inside the outer case of the electric storage module 51 is measured by the temperature measuring part 68. The analog temperature data measured by the temperature measuring part 68 is supplied to the temperature multiplexer 66 and is supplied from the temperature multiplexer 66 to the ADC 64. Then, the analog temperature data is converted into digital temperature data by the ADC 64. The digital temperature data is supplied from the ADC 64 to the monitoring part 67.

The electric storage module 51 has a current detecting section that detects a value of a current (load current) flowing through the current path of the electric storage module 51. The current detecting section detects the current value flowing through the sixteen submodules SMO. The current detecting section is composed of a current sensing resistor 69 connected between the negative electrode side of the submodule SMO 16 and the negative electrode terminal 62, and a current-sense amplifier 70 connected to both ends of the current sensing resistor 69. The current sensing resistor 69 detects the analog current data. The analog current data is detected at predetermined intervals, for example, during charging and discharging.

The detected analog current data is supplied to the current-sense amplifier 70. The analog current data is amplified by the current-sense amplifier 70. The gain of the current-sense amplifier 70 is set to, for example, about 50 to 100 times. The amplified analog current data is supplied to the ADC 71.

The ADC 71 converts the analog current data supplied from the current-sense amplifier 70 into the digital current data. The ADC 71 converts the analog current data into the digital current data of, for example, 14 to 18 bits. For a conversion method in the ADC 71, various methods such as the successive approximation method and the $\Delta\Sigma$ (delta sigma) method can be applied.

The ADC 71 includes, for example, an input terminal, an output terminal, a control signal input terminal to which a control signal is input, and a clock pulse input terminal to which a clock pulse is input (these terminals are not shown). Analog current data is input to the input terminal. Digital current data is output from the output terminal.

To the control signal input terminal of the ADC 71, for example, a control signal (control command) supplied from the controller 52 is input. The control signal is, for example, an acquisition instruction signal instructing acquisition of analog current data supplied from the current-sense amplifier 70. When the acquisition instruction signal is input, analog current data is acquired by the ADC 71, and the acquired analog current data is converted into digital current data. Then, digital current data is output from the output terminal according to the synchronization clock pulse input to the clock pulse input terminal. The output digital current data is supplied to the monitoring part 67. The digital current data is an example of current information. In addition, the ADC 64 and the ADC 71 may be configured as the same ADC.

The monitoring part 67 monitors the digital voltage data and the digital temperature data supplied from the ADC 64 and monitors the presence or absence of abnormality of the submodule SMO. For example, when the voltage indicated by the digital voltage data is in the vicinity of a voltage which is a measure of overcharging or in the vicinity of a voltage which is a measure of overdischarge, an abnormality notification signal indicating that there is an abnormality or abnormality may occur is generated. Furthermore, when the temperature of the submodule SMO or the temperature of the entire electric storage module 51 is larger than the threshold value, the monitoring part 67 similarly generates an abnormality notifying signal.

Further, the monitoring part 67 monitors the digital current data supplied from the ADC 71. When the current value indicated by the digital current data is larger than the threshold value, the monitoring part 67 generates an abnormality notification signal. The abnormality notification signal generated by the monitoring part 67 is transmitted to the submicro control unit 72 by a communication function of the monitoring part 67.

The monitoring part 67 monitors the presence or absence of the abnormality described above and transmits the digital voltage data for each of the 16 submodules SMO supplied from the ADC 64 and the digital current data supplied from the ADC 71 to the submicro control unit 72. Digital voltage data and digital current data for each submodule SMO may be directly supplied to the submicro control unit 72 without passing through the monitoring part 67. Digital voltage data and digital current data for each submodule SMO to be transmitted are input to the submicro control unit 72. Further, the digital temperature data supplied from the ADC 64 is supplied from the monitoring part 67 to the submicro control unit 72.

The submicro control unit 72 is composed of a CPU (Central Processing Unit) or the like having a communication function, and controls each part of the electric storage module 51. When the abnormality notification signal is supplied from the monitoring part 67, for example, the submicro control unit 72 notifies the main micro control unit 80 of the controller 52 of the abnormality using the communication function. According to the notification, the main micro control unit 80 appropriately executes processing such as stopping charging or discharging. The notation of sub and main in the submicro control unit and the main micro control unit is for the sake of convenience of explanation and has no special meaning.

Bidirectional communication conforming to the standards such as I2C, SMBus (System Management Bus), SPI (Serial Peripheral Interface), CAN, etc., which is a serial communication standard, is performed between the submicro control unit 72 and the main micro control unit 80. Communication may be wired or wireless.

Digital voltage data is input from the monitoring part 67 to the submicro control unit 72. For example, the digital voltage data for each submodule SMO at the time of discharge of the electric storage module 51 is input to the submicro control unit 72.

Furthermore, the magnitude of the load current (digital current data) at the time when the load is connected to the electric storage module 51 is input from the monitoring part 67 to the submicro control unit 72. Digital temperature data indicating the temperature of each submodule SMO and the temperature inside the electric storage module 51 is input to the submicro control unit 72.

The submicro control unit 72 transmits, to the main micro control unit 80, digital voltage data for each input submodule SMO, digital temperature data indicating the temperature of each submodule SMO, digital current data, and the like.

The storage part 73 is composed of a ROM (Read Only Memory), a RAM (Random Access Memory), and the like. In the storage part 73, for example, a program executed by the submicro control unit 72 is stored. The storage part 73 is further used as a work area at the time when the submicro control unit 72 executes processing.

The storage part 73 stores history information on the electric storage module 51. The history information includes, for example, charge conditions such as a charge rate, a charge time and a charge count, discharge conditions such as a discharge rate, a discharge time and a discharge count, information of temperature, and the like. These pieces of information may be recorded in units of the electric storage block BL, the submodule SMO and the secondary battery, respectively. The submicro control unit 72 may perform processing of referring to the history information.

An example of the configuration of the controller 52 according to an embodiment will be described. The controller 52 manages charging and discharging for one or a plurality of electric storage modules 51. Specifically, the controller 52 starts and stops charging of the electric storage module 51, starts and stops discharging of the electric storage module 51, and sets the charging rate and discharging rate, and the like. For example, the controller 52 has a configuration having an outer case similarly to the electric storage module 51.

The controller 52 has a configuration including a main micro control unit 80, a positive electrode terminal 81, a negative electrode terminal 82, a positive electrode terminal 83, a negative electrode terminal 84, a charge control part 85, a discharge control part 86, a storage part 87, a switch SW1 and a switch SW2. The switch SW1 is connected to the terminal 87a or the terminal 87b. The switch SW2 is connected to the terminal 88a or the terminal 88b.

The positive electrode terminal 81 is connected to the positive electrode terminal 61 of the electric storage module 51. The negative electrode terminal 82 is connected to the negative electrode terminal 62 of the electric storage module 51. The positive electrode terminal 83 and the negative electrode terminal 84 are connected to the charging device 53 or the load 54 connected to the controller 52.

The main micro control unit 80 is composed of a CPU having a communication function, and controls each part of the controller 52. The main micro control unit 80 controls charging and discharging according to an abnormality notification signal transmitted from the submicro control unit 72 of the electric storage module 51. When the abnormality notification signal notifies, for example, the possibility of overcharging, the main micro control unit 80 turns off at least the switching element of the charge control part 85 and stops charging. When the abnormality notification signal notifies, for example, the possibility of overdischarge, the main micro control unit 80 turns off at least the switching element of the discharge control part 86 and stops discharging.

When an alarm signal notifies, for example, that there is deterioration of the submodule SMO, the main micro control unit 80 turns off the switching elements of the charge control part 85 and the discharge control part 86 and stops use of the electric storage module 51. In the case where the electric storage module 51 is used as, for example, a backup power source, the use of the electric storage module 51 is not stopped immediately but the use of the electric storage module 51 is stopped at an appropriate timing.

In addition to managing the charging and discharging of the electric storage module 51, the main micro control unit 80 refers to the history information such as the voltage, the temperature, the number of cycles, etc. of the submodule SMO transmitted from the submicro control unit 72, and controls so as to execute the charge-discharge method described later. In addition, the submicro control unit 72 may have a part of the functions of the main micro control unit 80 described below.

The main micro control unit 80 can perform communication with the CPUs of the charging device 53 and the load 54 or the like. The main micro control unit 80 sets the charging voltage and the charging rate (magnitude of charging current) for the electric storage module 51, and transmits the set charging voltage and charging rate to the charging device 53. The charging voltage and charging current control part 53a appropriately sets the charging voltage and the charging current according to the charging voltage and the charging rate transmitted from the main micro control unit 80.

The main micro control unit 80 sets the discharging rate (magnitude of discharging current) of the discharge of the electric storage module 51, and transmits the set discharging rate to the load 54. The discharging current control part 54a of the load 54 appropriately sets the load so that it becomes the discharging current according to the discharging rate transmitted from the main micro control unit 80.

The charge control part 85 includes a charge control switch 85a and a diode 85b connected in the forward direction with respect to the discharging current in parallel with the charge control switch 85a. The discharge control part 86 includes a discharge control switch 86a and a diode 86b connected in the forward direction with respect to the charging current in parallel with the discharge control switch 86a. As the charge control switch 85a and the discharge control switch 86a, for example, IGBT (Insulated Gate Bipolar Transistor) or MOSFET (Metal Oxide Semiconductor Field Effect Transistor) can be used. The charge control part 85 and the discharge control part 86 may be inserted into a negative power source line.

The storage part 87 is composed of a ROM, a RAM, and the like. In the storage part 87, for example, a program executed by the main micro control unit 80 is stored. The storage part 87 is used as a work area at the time when the main micro control unit 80 executes processing. The above-mentioned history information may be stored in the storage part 47.

The switch SW1 is connected to a positive power source line connected to the positive electrode terminal 83. When charging the electric storage module 51, the switch SW1 is connected to the terminal 87*a*, and when discharging the electric storage module 51, the switch SW1 is connected to the terminal 87*b*.

The switch SW2 is connected to the negative power source line connected to the negative electrode terminal 84. When charging the electric storage module 51, the switch SW2 is connected to the terminal 88*a*, and when discharging the electric storage module 51, the switch SW2 is connected to the terminal 88*b*. Switching between the switch SW1 and the switch SW2 is controlled by the main micro control unit 80.

The battery condition analysis section 10 described herein is connected to, for example, the monitoring part 67 and the like in the electric storage module 51. Then, as described above, AC current is supplied to a predetermined unit of battery to measure AC impedance, and the state or state change of the battery is detected from DRT obtained based on the result.

In addition, the electric storage module 51 or the like may have a part or all of the functions of the battery condition analysis section 10. For example, the alternating current generator 10*a* may be provided in the charging device 53 so that an alternating current is supplied from the outside of the electric storage module 51. Further, the voltage measuring section 10*b* may be composed of the voltage multiplexer 63, the ADC 64 and the like. Further, the calculating section 10*c* may be composed of the monitoring part 67 or the like.

When the battery condition analysis section 10 is applied to the electric storage module 51, processing of determining deterioration or the like of the battery at an appropriate timing during a normal charge-discharge cycle (for example, processing of steps ST14 to ST19 in the flowchart shown in FIG. 4) is performed.

An embodiment of the present technology described herein can be realized as, for example, an electronic device, an electric vehicle, an electronic device connected to an electric storage device, or the like. Hereinafter, application examples will be described.

Examples of the electronic device include a notebook computer, a smartphone, a tablet terminal, a PDA (portable information terminal), a mobile phone, a wearable terminal, a cordless phone handset, a video movie, a digital still camera, an electronic book, an electronic dictionary, a music player, a radio, a headphone, a game machine, a navigation system, a memory card, a pacemaker, a hearing aid, an electric tool, an electric shaver, a refrigerator, an air conditioner, a television set, a stereo, a water heater, a microwave oven, a dishwasher, a washing machine, a drier, lighting equipment, a toy, medical equipment, a robot, a load conditioner, a traffic light, and the like.

Examples of electric vehicles include railway vehicles, golf carts, electric carts, electric automobiles (including hybrid automobile), and the like, which are used as a power source for driving or an auxiliary power source thereof.

Examples of the electric storage device include power sources for electric power storage for buildings including houses or power generation facilities.

A specific example using the electric storage device (electric storage module) of the above-described present technology among the above-mentioned application examples will be described below.

Figure 8:
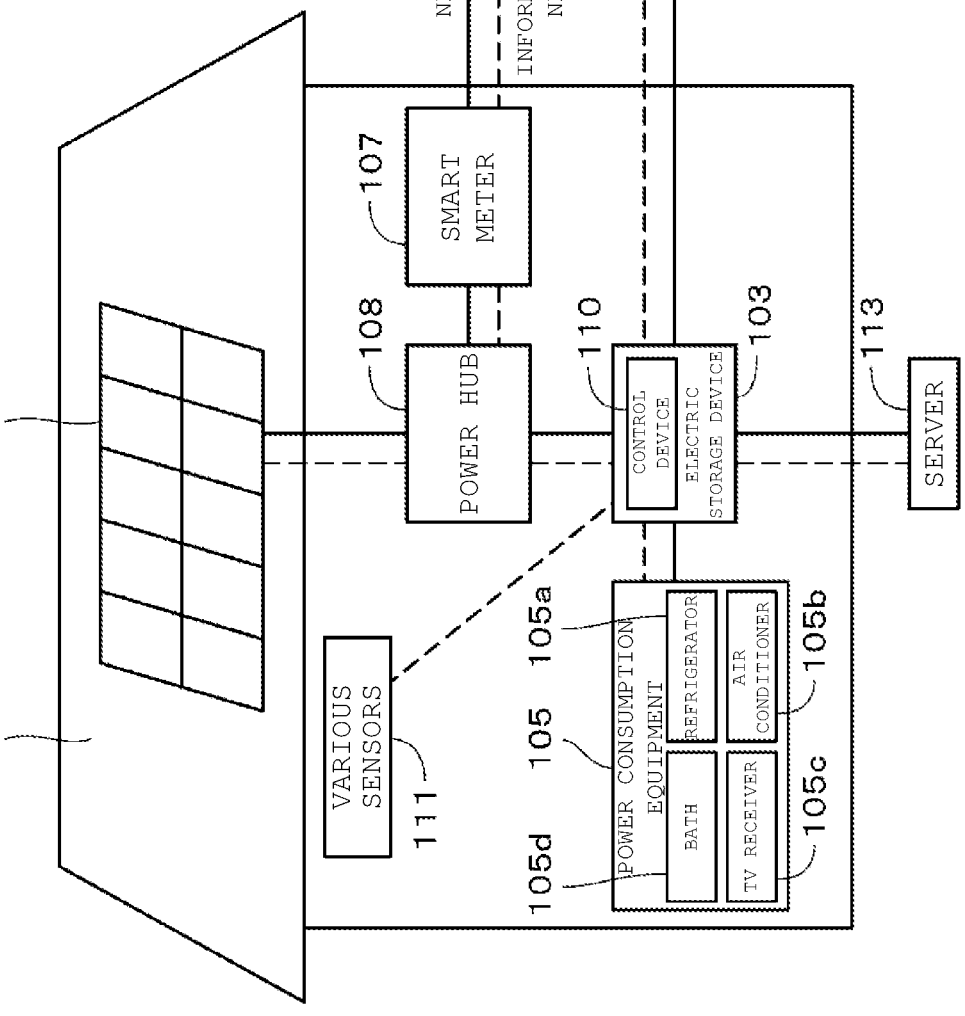
FIG. 8 is a view for explaining an application example according to an embodiment.

An example of an electric storage system to which the present technology can be applied will be described with reference to FIG. 8. For example, in the electric storage system 100 for houses 101, electric power is supplied from a centralized electric power system 102 such as a thermal power generation 102*a*, a nuclear power generation 102*b*, and a hydraulic power generation 102*c* to the electric storage device 103 via a power network 109, an information network 112, a smart meter 107, a power hub 108, and the like. With this, electric power is supplied from an independent power source such as domestic power generation device 104 to the electric storage device 103. The electric power supplied to the electric storage device 103 is stored. Electric power to be used in the house 101 is supplied using the electric storage device 103. A similar electric storage system can be used not only for the house 101 but also for a building.

In the house 101, the power generation device 104, power consumption equipment 105, the electric storage device 103, a control device 110 that controls each device, the smart meter 107, and sensors 111 that acquire various kinds of information are provided. The respective devices are connected by the power network 109 and the information network 112. A solar cell, a fuel cell, or the like is used as the power generation device 104, and the generated electric power is supplied to the power consumption equipment 105 and/or the electric storage device 103. The power consumption equipment 105 is a refrigerator 105*a*, an air conditioner 105*b* that is an air conditioner, a television set 105*c* that is a television receiver, a bath 105*d*, and the like. Furthermore, the power consumption equipment 105 includes an electric vehicle 106. The electric vehicle 106 is an electric automobile 106*a*, a hybrid car 106*b*, an electric motorbicycle 106*c* or the like.

The electric storage device (which may be an electric storage system) as described herein is applied to the electric storage device 103. The smart meter 107 has a function of measuring the use amount of commercial power and sending the use amount measured to an electric power company. The power network 109 may be any one or combination of DC (direct current) power supply, AC (alternate current) power supply, and non-contact power supply.

The various sensors 111 are, for example, a human detection sensor, an illuminance sensor, an object detection sensor, a power consumption sensor, a vibration sensor, a contact sensor, a temperature sensor, an infrared sensor, and the like. Information acquired by the various sensors 111 is transmitted to the control device 110. Based on the information from the sensors 111, the state of weather, the state of person, etc., are grasped and the power consumption equipment 105 is automatically controlled to allow minimization of the energy consumption. Further, the control device 110 can transmit information relating to the house 101 to an external electric power company or the like via an Internet.

Branching of the power line, processing of DC-AC conversion, and the like are carried out by the power hub 108. As a communication system of the information network 112 connected to the control device 110, there are a method of using a communication interface such as UART (Universal Asynchronous Receiver-Transmitter: transmitting/receiving circuit for asynchronous serial communication) and a method of utilizing a sensor network based on a wireless communication standard such as Bluetooth (registered trademark), ZigBee (registered trademark) or Wi-Fi. Bluetooth (registered trademark) system is applied to multimedia communication and allows communication of a one-tomany connection. ZigBee (registered trademark) is a communication system using a physical layer of IEEE (Institute of Electrical and Electronics Engineers) 802.15.4. IEEE 802.15.4 is the name of a short-range wireless network standard called PAN (Personal Area Network) or W (Wireless) PAN.

The control device 110 is connected to an external server 113. The server 113 may be managed by any of the house 101, an electric power company, and a service provider. The information transmitted and received by the server 113 is, for example, power consumption information, life pattern information, electric power bill, weather information, natural disaster information, and information relating to power trading. These pieces of information may be transmitted from and received to power consumption equipment (for example, a television receiver) in the home, or may be transmitted from and received to a device outside the home (for example, mobile phone, etc.). These pieces of information may be displayed on apparatus having a display function, such as a television receiver, a mobile phone, and a PDA (personal digital assistants).

The control device 110 (controller) that controls the respective parts is configured by CPU (Central Processing Unit) or a processor, RAM (Random Access Memory), ROM (Read Only Memory) and the like, and is stored in the electric storage device 103 in this example. The control device 110 is connected to the electric storage device 103, the domestic power generation device 104, the power consumption equipment 105, the various sensors 111, and the server 113 via the information network 112, and has, for example, a function of adjusting the use amount of commercial power and the amount of power generation. In addition to this, the control device 110 may have a function of carrying out power trading in a power market and the like.

As described herein, not only electric power by the centralized electric power system 102 of the thermal power generation 102a, the nuclear power generation 102b, the hydraulic power generation 102c or the like, but also generated electric power of the domestic power generation device 104 (solar power generation, wind power generation) can be stored in the electric storage device 103. Therefore, even though the generated electric power of the domestic power generation device 104 varies, it is possible to perform such control that the amount of electric power sent to the outside is made constant or discharge is performed as much as needed. For example, electric power obtained by solar power generation is stored in the electric storage device 103 and low-cost late-night power is stored in the electric storage device 103 in the night. Furthermore, the electric power stored by the electric storage device 103 is discharged and utilized in a high-cost time zone in the daytime.

Although the example in which the control device 110 is stored in the electric storage device 103 has been described in this example, the control device 110 may be stored in the smart meter 107 or may be configured singly. Further, the electric storage system 100 may be used for a plurality of homes in a collective housing, or may be used for a plurality of single-family houses.

Figure 9:
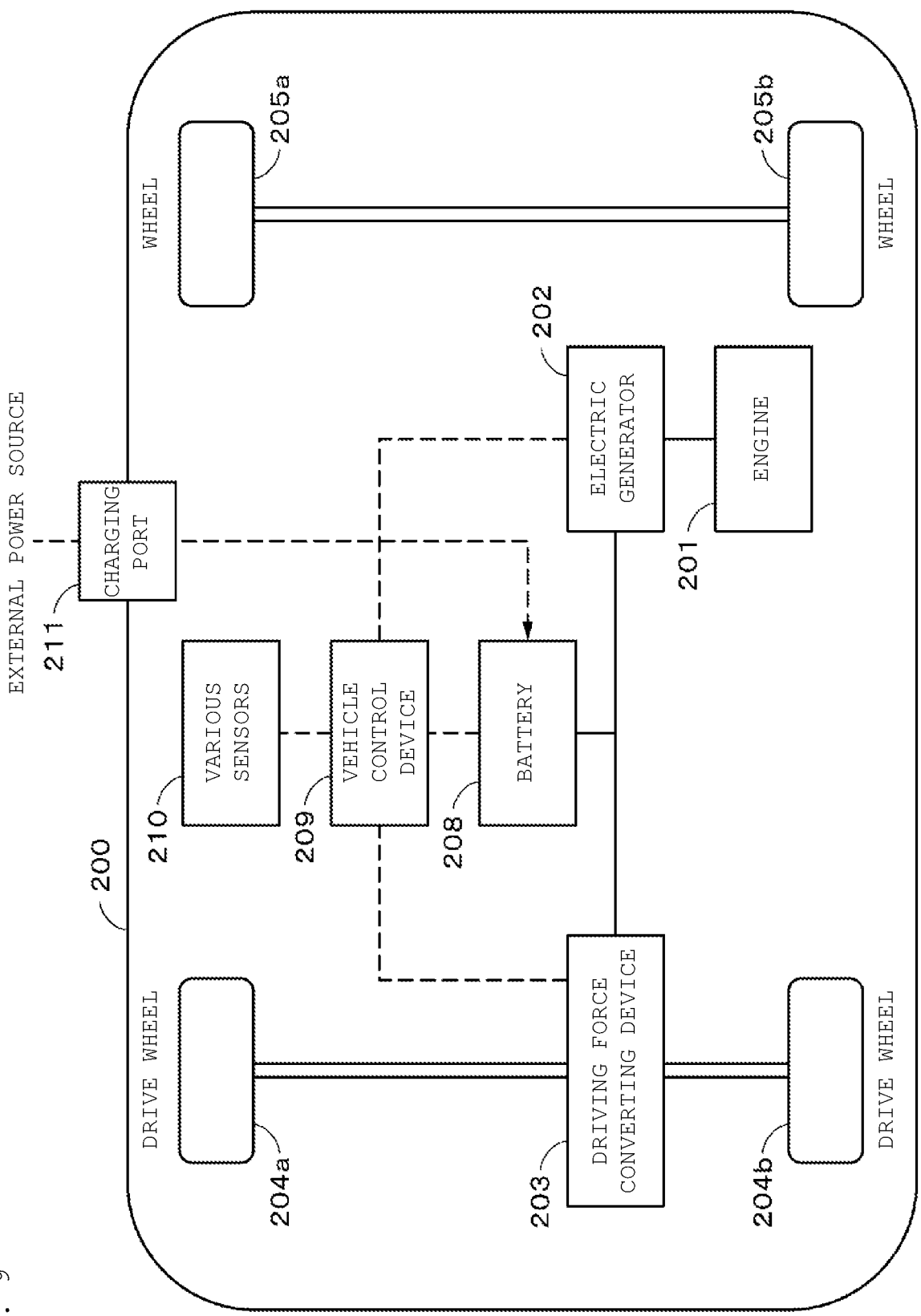
FIG. 9 is a view for explaining an application example according to an embodiment.

An example in which the present technology is applied to an electric storage system for a vehicle will be described with reference to FIG. 9. FIG. 9 schematically shows an example of a configuration of a hybrid vehicle employing a series hybrid system to which the present technology is applied. The series hybrid system is a car that runs with an electric power driving force converting device by using electric power generated by an electric generator activated through an engine or electric power once stored in a battery.

In the hybrid vehicle 200, an engine 201, an electric generator 202, an electric power driving force converting device 203, a driving wheel 204a, a driving wheel 204b, a wheel 205a, a wheel 205b, a battery 208, a vehicle control device 209, various sensors 210, and a charging port 211 are mounted. The electric storage device described above is applied to the hybrid vehicle 200.

The hybrid vehicle 200 runs by using the electric power driving force converting device 203 as a power source. One example of the electric power driving force converting device 203 is a motor. The electric power driving force converting device 203 is operated by the electric power of the battery 208 and a rotational force of the electric power driving force converting device 203 is transmitted to the driving wheels 204a and 204b. By using direct current-alternate current (DC-AC) or reverse conversion (AC-DC conversion) for the necessary place, the electric power driving force converting device 203 can be applied to both an AC motor and a DC motor. The various sensors 210 control an engine rotational speed via the vehicle control device 209 and control the opening degree of a throttle valve that is not shown in the diagram (throttle opening). The various sensors 210 include a velocity sensor, an acceleration sensor, an engine rotational speed sensor, or the like.

The rotational force of the engine 201 is transmitted to the electric generator 202, and the electric power generated by the electric generator 202 through the rotational force can be accumulated in the battery 208.

When the hybrid vehicle 200 decelerates by a braking mechanism that is not shown in the diagram, resistance force at the time of deceleration is applied to the electric power driving force converting device 203 as a rotational force, and regenerative electric power generated by the electric power driving force converting device 203 by the rotational force is accumulated in the battery 208.

It is also possible that the battery 208 is connected to a power source outside the hybrid vehicle 200 to thereby receive supply of electric power from the external power source by using the charging port 211 as an input port and accumulate the received power.

Although not shown in the diagram, the hybrid vehicle 200 may include an information processing device which executes information processing relating to vehicle control based on information concerning the secondary battery. As such an information processing device, for example, there is an information processing device for displaying the battery remaining capacity based on information concerning the remaining capacity of the battery, or the like.

The above is an example of the series hybrid car which runs with a motor by using electric power generated by an electric generator activated through an engine or electric power once stored in a battery. However, the present technology can be effectively applied also to a parallel hybrid car which employs both outputs of engine and motor as the drive source and uses, with appropriate switching, three systems, running by only the engine, running by only the motor, and running by the engine and the motor. Furthermore, the present technology can be effectively applied also to a so-called electric vehicle which does not use an engine and runs by driving by only a drive motor.

Although the embodiments of the present technology have been specifically described above, the present invention is not limited to the embodiments described above, and various modifications based on the technical idea of the present technology are possible.

Figure 10:
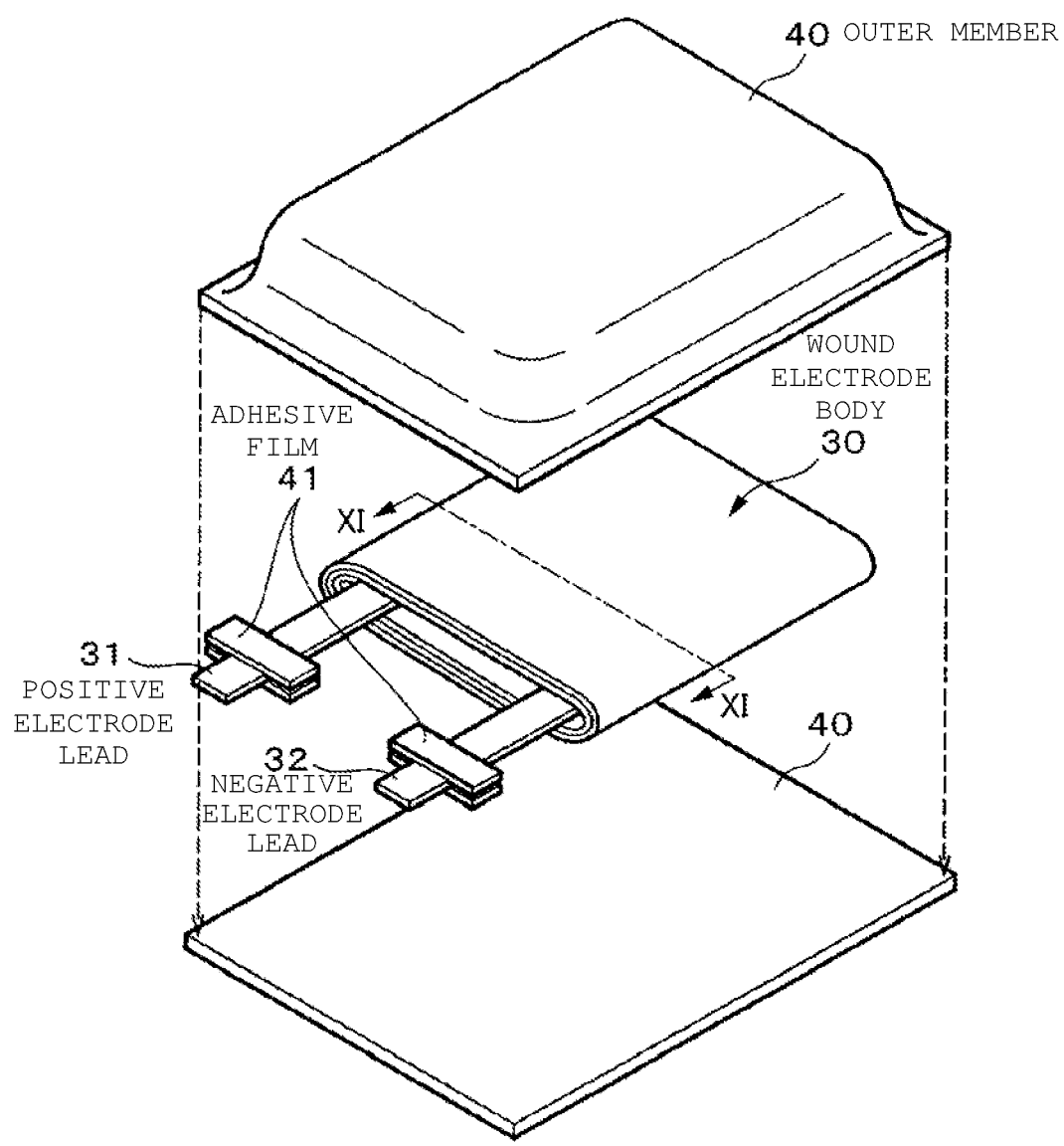
FIG. 10 is a view illustrating a configuration example of a battery according to an embodiment.

FIG. 10 is an exploded perspective view showing a configuration example of a nonaqueous electrolyte secondary battery according to a modification example of the present technology. This nonaqueous electrolyte secondary battery is a so-called flat type or rectangular type, in which the wound electrode body 30 to which a positive electrode lead 31 and a negative electrode lead 32 are attached is housed inside a film-like outer member 40, and it is possible to reduce a size, a weight, and a thickness.

The positive electrode lead 31 and the negative electrode lead 32 are led out from the inside to the outside of the outer member 40, for example, in the same direction. Each of the positive electrode lead 31 and the negative electrode lead 32 is made of a metal material such as aluminum, copper, nickel, stainless steel, or the like, and each has a thin plate shape or mesh shape.

The outer member 40 is made of, for example, a rectangular aluminum laminated film obtained by bonding a nylon film, an aluminum foil and a polyethylene film in this order. The outer member 40 is disposed, for example, such that the polyethylene film side and the wound electrode body 30 are opposed to each other, and each outer edge portion is adhered to each other by fusion bonding or an adhesive. An adhesive film 41 for preventing entry of outside air is inserted between the outer member 40 and the positive electrode lead 31 and the negative electrode lead 32. The adhesive film 41 is made of a material having adhesiveness to the positive electrode lead 31 and the negative electrode lead 32, for example, a polyolefin resin such as polyethylene, polypropylene, modified polyethylene, or modified polypropylene.

The outer member 40 may be formed of a laminate film having another structure, a polymer film such as polypropylene, or a metal film instead of the aluminum laminate film described above. Alternatively, a laminate film in which a polymer film is laminated on one surface or both surfaces of an aluminum film as a core material may be used.

Figure 11:
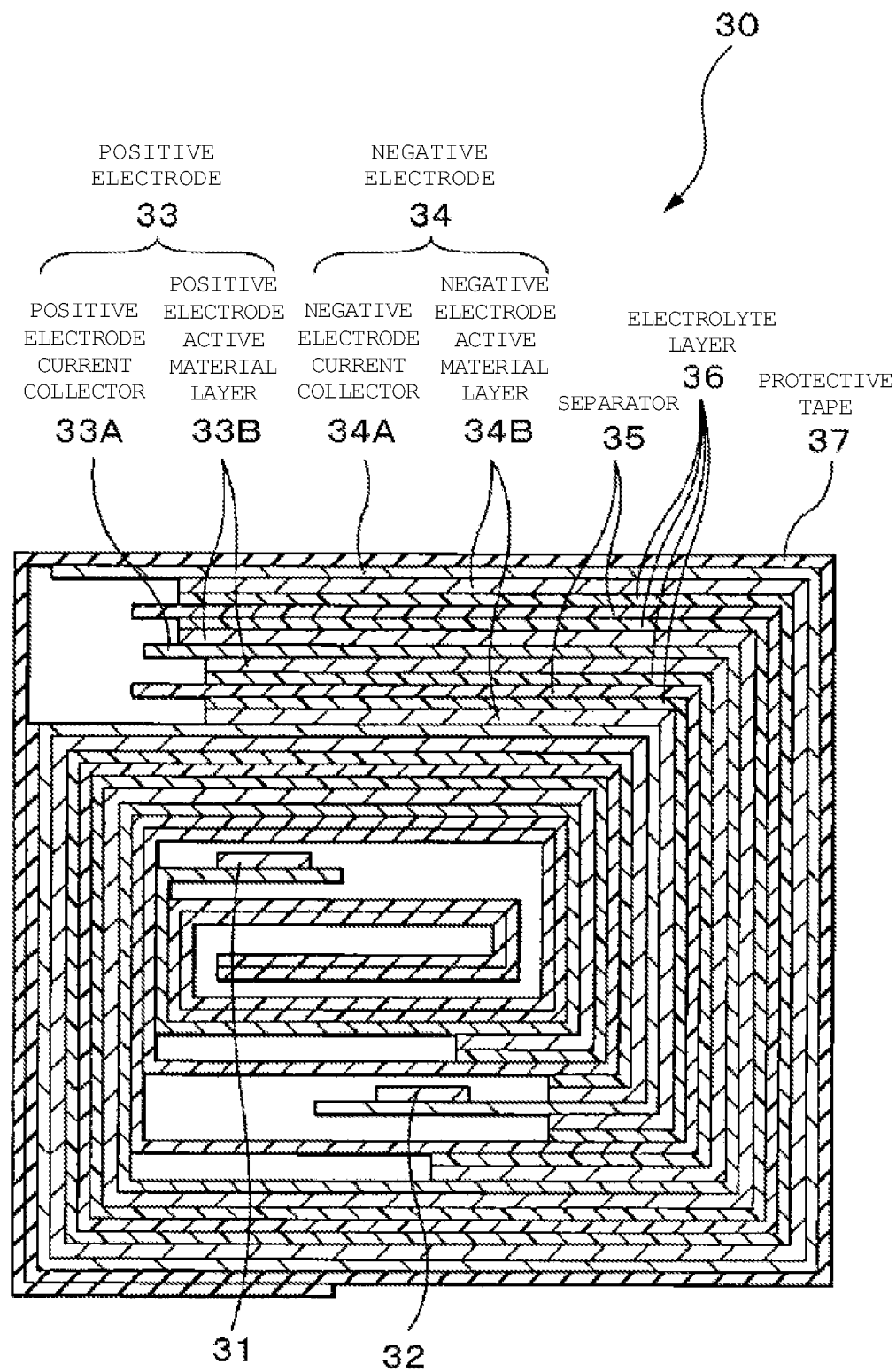
FIG. 11 is a view showing a configuration example of a battery according to an embodiment.

FIG. 11 is a cross-sectional view taken along the line XI-XI of the wound electrode body 30 shown in FIG. 10. The wound electrode body 30 is formed by laminating and winding a positive electrode 33 and a negative electrode 34 with a separator 35 and an electrolyte layer 36 interposed therebetween, and its outermost peripheral portion is protected by a protective tape 37.

The positive electrode 33 has a structure in which the positive electrode active material layer 33B is provided on one surface or both surfaces of the positive electrode current collector 33A. The negative electrode 34 has a structure in which the negative electrode active material layer 34B is provided on one surface or both surfaces of the negative electrode current collector 34A and is arranged so that the negative electrode active material layer 34B and the positive electrode active material layer 33B are opposed to each other. The configurations of the positive electrode current collector 33A, the positive electrode active material layer 33B, the negative electrode current collector 34A, the negative electrode active material layer 34B and the separator 35 are the same as those of the positive electrode current collector 21A, the positive electrode active material layer 21B, the negative electrode current collector 22A, the negative electrode active material layer 22B, and the separator 23 in the first embodiment.

The electrolyte layer 36 contains an electrolytic solution and a polymer compound serving as a holding body for holding the electrolytic solution, and is in a so-called gel state. The gel electrolyte layer 36 is preferred because it can achieve high ionic conductivity and can prevent leakage of the battery. The electrolytic solution is the same as the electrolytic solution in the first embodiment. Examples of the polymer compound include polyacrylonitrile, polyvinylidene fluoride, a copolymer of vinylidene fluoride and hexafluoropropylene, polytetrafluoroethylene, polyhexafluoropropylene, polyethylene oxide, polypropylene oxide, polyphosphazene, polysiloxane, polyvinyl acetate, polyvinyl alcohol, polymethyl methacrylate, polyacrylic acid, polymethacrylic acid, styrene-butadiene rubber, nitrile-butadiene rubber, polystyrene, polycarbonate, and the like. In particular, from the viewpoint of electrochemical stability, polyacrylonitrile, polyvinylidene fluoride, polyhexafluoropropylene and polyethylene oxide are preferred.

In addition, in one embodiment, the inorganic substance similar to the inorganic material described in the description of the resin layer of the separator 23 may be contained in the gel-like electrolyte layer 36. The reason for this is that heat resistance can be further improved.

Next, an example of a method for manufacturing a nonaqueous electrolyte secondary battery according to an embodiment of the present technology will be described.

First, a precursor solution containing a solvent, an electrolyte salt, a polymer compound, and a mixed solvent is applied to each of the positive electrode 33 and the negative electrode 34, and the mixed solvent is volatilized to form the electrolyte layer 36. Next, the positive electrode lead 31 is attached to an end portion of the positive electrode current collector 33A by welding, and the negative electrode lead 32 is attached to an end portion of the negative electrode current collector 34A by welding. Next, the positive electrode 33 and the negative electrode 34 on which the electrolyte layer 36 is formed are laminated with the separator 35 interposed therebetween to form a laminate, and then the laminate is wound in the longitudinal direction, and the protective tape 37 is bonded to the outermost peripheral portion to form a wound electrode body 30. Finally, for example, the wound electrode body 30 is sandwiched between the outer members 40, and the outer edges of the outer members 40 are brought into close contact with each other by thermal fusion or the like and sealed. At this time, the adhesive films 41 are inserted between the positive electrode lead 31 and the outer member 40 and between the negative electrode lead 32 and the outer member 40 respectively. Thereby, the secondary battery shown in FIG. 10 and FIG. 11 is obtained.

Further, this secondary battery may be prepared in the following manner. First, the positive electrode 33 and the negative electrode 34 are prepared as described above, and the positive electrode lead 31 and the negative electrode lead 32 are attached to the positive electrode 33 and the negative electrode 34, respectively. Then, the positive electrode 33 and the negative electrode 34 are laminated with the separator 35 interposed therebetween and wound, and the protective tape 37 is bonded to the outermost peripheral portion to form a wound body. Next, the wound body is sandwiched between the outer members 40, and the outer peripheral edge portion excluding one side is thermally fused to form a bag shape and the wound body is housed inside the outer member 40. Next, a composition for an electrolyte containing a solvent, an electrolyte salt, a monomer as a raw material of the polymer compound, a polymerization initiator, and, if necessary, another material such as a polymerization inhibitor, is prepared, and injected into the inside of the outer member 40.

Next, after injecting the composition for electrolyte into the outer member 40, an opening of the outer member 40 is thermally fused and sealed in a vacuum atmosphere. Next, heat is applied to polymerize the monomer to obtain a polymer compound, and thereby a gel-like electrolyte layer 36 is formed. Accordingly, the secondary battery shown in FIG. 10 and FIG. 11 is obtained. A secondary battery according to the modification example described above may be used.

Hereinafter, reference examples of the present technology will be described, but the present technology is not limited to the following reference examples.

A positive electrode was produced as follows. First, lithium carbonate ($Li_2CO_3$) and cobalt carbonate ($CoCO_3$) were mixed in a molar ratio of 0.5:1 and then calcined at 900° C. for 5 hours in air to obtain lithium cobalt composite oxide ($LiCoO_2$) as a positive electrode active material. Next, a positive electrode mixture was formed by mixing 91 parts by mass of lithium cobalt composite oxide thus obtained, 6 parts by mass of graphite as a conductive agent, and 3 parts by mass of polyvinylidene fluoride as a binder, and then a paste-like positive electrode mixture slurry was formed by dispersing the mixture slurry in N-methyl-2-pyrrolidone. Next, the positive electrode mixture slurry was applied onto both surfaces of a positive electrode current collector made of a band-shaped aluminum foil (12 μm in thickness), dried, and then, compression-molded by a roll-press machine to form a positive electrode active material layer. Then, a positive electrode lead made of aluminum was attached to one end of the positive electrode current collector by welding.

A negative electrode was prepared as follows. First, a negative electrode mixture was formed by mixing 97 parts by mass of artificial graphite powder as a negative electrode active material and 3 parts by mass of polyvinylidene fluoride as a binder, and the mixture was dispersed in N-methyl-2-pyrrolidone, thereby forming a paste-like negative electrode mixture slurry. Next, the negative electrode mixture slurry was applied onto both surfaces of a negative electrode current collector made of a band-shaped copper foil (15 μm in thickness), dried, and then, compression-molded by a roll-press machine to form a negative electrode active material layer. Next, a negative electrode lead made of nickel was attached to one end of the negative electrode current collector.

A laminate type battery was produced as follows. First, the prepared positive electrode and negative electrode were brought into close contact with each other with a separator made of a microporous polyethylene film having a thickness of 25 μm interposed therebetween, wound in the longitudinal direction, and a protective tape was attached to the outermost peripheral portion to prepare a flattened wound electrode body. Next, the wound electrode body was loaded between outer members, and three sides of the outer member were thermally fused, so that one side of the outer member was not thermally fused and had an opening. As the outer member, a moisture-proof aluminum laminated film in which a nylon film having a thickness of 25 μm, an aluminum foil having a thickness of 40 μm, and a polypropylene film having a thickness of 30 μm were laminated in this order from the outermost layer was used.

A gel-like electrolyte layer was prepared as follows. First, a mixed solvent was prepared by mixing ethylene carbonate (EC) and propylene carbonate (PC) in the volume ratio of 6:4, and lithium hexafluorophosphate ($LiPF_6$) was dissolved in the mixed solvent at a rate of 1.0 kmol/kg to prepare an electrolytic solution. Next, polyvinylidene fluoride copolymerized with hexafluoropropylene in a ratio of 6.9%, an electrolytic solution, and dimethyl carbonate (DMC) as a diluent solvent were mixed in a mass ratio of 1:6:12, and the resulting mixture was stirred and dissolved to obtain a sol-like electrolyte solution. Next, the obtained so-like electrolyte solution was uniformly applied onto both surfaces of the positive electrode and the negative electrode. Next, the applied solution was dried to remove the solvent to form a gel-like electrolyte layer on both surfaces of the positive electrode and the negative electrode.

Next, a band-shaped positive electrode having a gel-like electrolyte layer formed on both surfaces and a band-shaped negative electrode having a gel-like electrolyte layer formed on both surfaces are laminated with a separator interposed therebetween and wound in a longitudinal direction to prepare a flat type battery element.

Next, as an outer member, a rectangular aluminum laminated film in which a nylon film, an aluminum foil and a polyethylene film were laminated in this order was prepared. Next, embossed molding was applied to one region of the surface of the aluminum laminated film on the side of the polyethylene film, which is divided into two by a folding portion bisecting the long side, and thereby an embossed molded part as a housing space was formed.

Next, the battery element was housed in the emboss molded part, the aluminum laminated film was folded back at the folding portion, and the opposing sides of the aluminum laminated film were overlaid so as to sandwich the positive electrode lead and the negative electrode lead. At that time, adhesive films were inserted between the positive electrode lead/the negative electrode lead and the aluminum laminated film. Next, the overlaid polyethylene films of the laminated films were bonded to each other by thermal fusion, and the battery element was sealed with a laminate film.

Next, the battery element sealed with the laminated film was heated while pressurizing, and thereby the positive electrode, the negative electrode, and the separator constituting the battery element are integrated. As a result, a desired flat battery was obtained.

Charge-discharge cycle tests were carried out on the above batteries in a thermostatic bath at 10° C., 23° C., 35° C. and 45° C.

As an AC impedance measurement method, an electrochemical measurement apparatus VSP (equipped with a FRA board) manufactured by Bio-Logic Science Instruments SAS was used.

The measurement was carried out in a thermostatic bath SU-641 manufactured by ESPEC CORP.

The conditions are as follows.

Battery state: Full charge temperature: 10° C. Voltage amplitude: 10 mV Frequency range: 1 MHz to 10 MHz.

As a calculation method of DRT, a method using Fourier transform and window function combination is used, and a program for numerical calculation software MATLAB was made. Specifically, using the measurement data of the impedance imaginary part, a process of data preprocessing→extrapolation of frequency value→application of window function→Fourier transformation→calculation-→inverse Fourier transformation→multiplication of total resistance value Rp was taken. For data exclusion, simple data deletion on the high frequency side and equivalent circuit analysis only on the lower frequency side than the arc terminal end portion which can be easily performed on the low frequency side were used. The width of the frequency value to which the window function is applied has been arranged within the range that there is no problem in the frequency resolution of the data and the vibrational data distortion.

In FIG. 12, the impedance measurement result (Nyquist diagram) is shown. The horizontal axis of the graph of FIG. 12 is a real number component, and the vertical axis is a coordinate plane (complex plane) which is an imaginary number component. Also, in FIG. 12, measurement results are shown by five kinds of lines L1 to L5, and each line shows measurement results in increments of 50 cycles (L1 is a result before cycle test), and the progress has proceeded (the number of cycles increases) from L1 to L5.

Figure 12A:
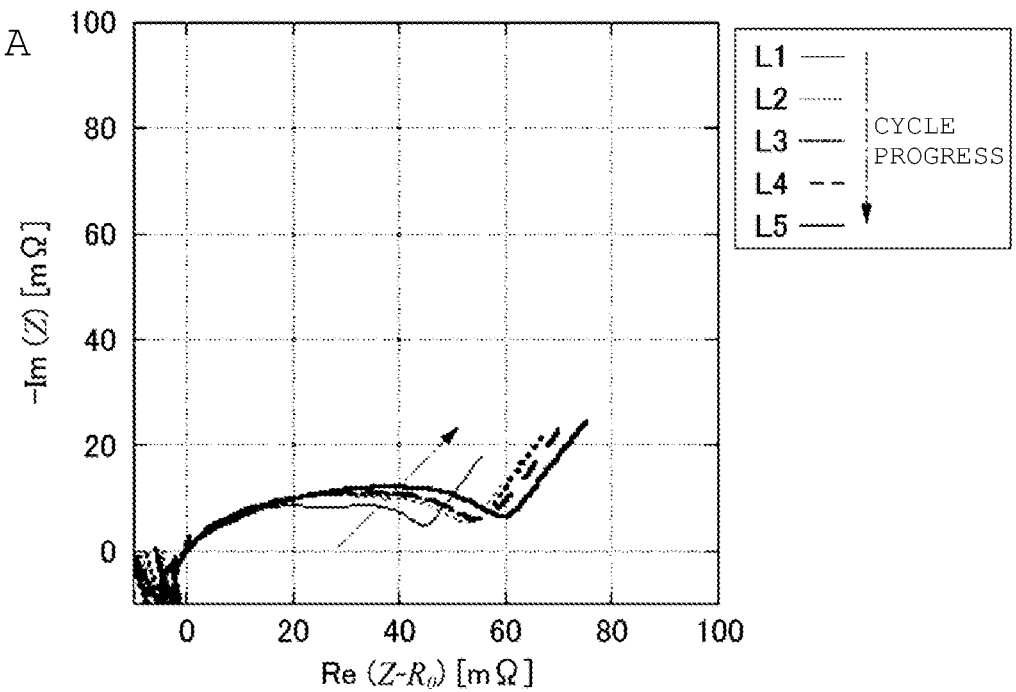
FIGS. 12A and 12B are views illustrating the measurement results of the AC impedance of a battery in a reference example.
Figure 12B:
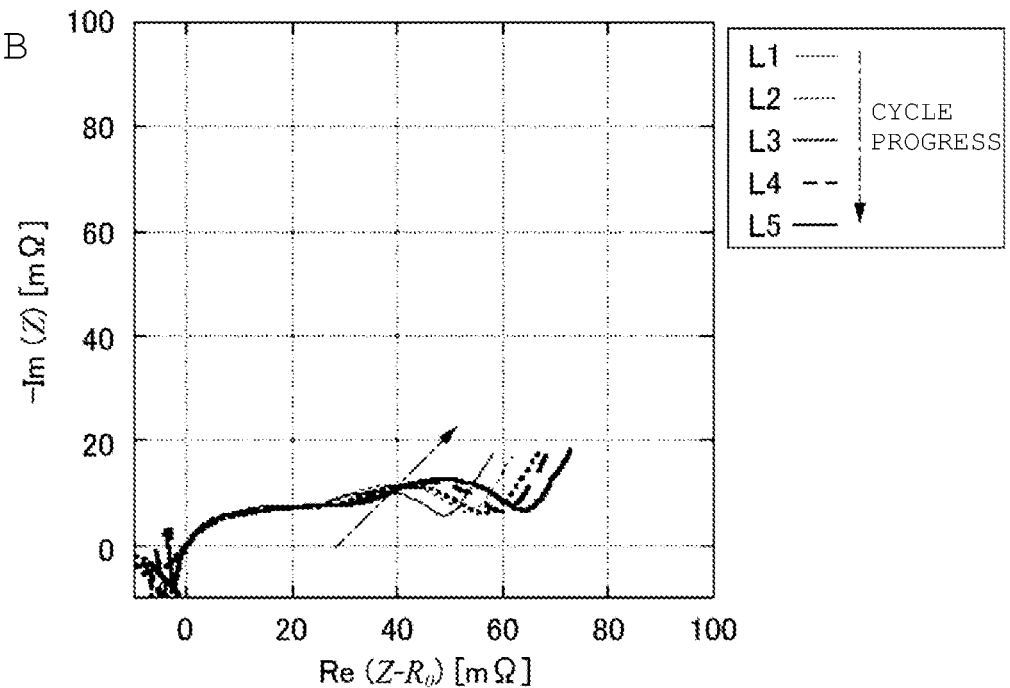

FIG. 12A is an impedance measurement result (Nyquist diagram) of a battery subjected to a charge-discharge cycle test at 10° C., an FIG. 12B is an impedance measurement result of a battery subjected to a charge-discharge cycle test at 45° C. An impedance measurement result is obtained by plotting the point where the horizontal axis is the real number component of an impedance Z at the predetermined frequency and the vertical axis is the imaginary number component value of the impedance Z. In the Nyquist diagram, in order to adequately compare the arc components, the resistance component RO of the real axis intercept is subtracted and the diagram is shown in a form passing through the coordinate origin. In the Nyquist diagram, roughly two arc components are confirmed in both cases, but with this alone, further detailed analysis is qualitatively difficult. Even in the equivalent circuit analysis, it is difficult to uniquely determine the number of circuit elements to be assumed.

Figure 13A:
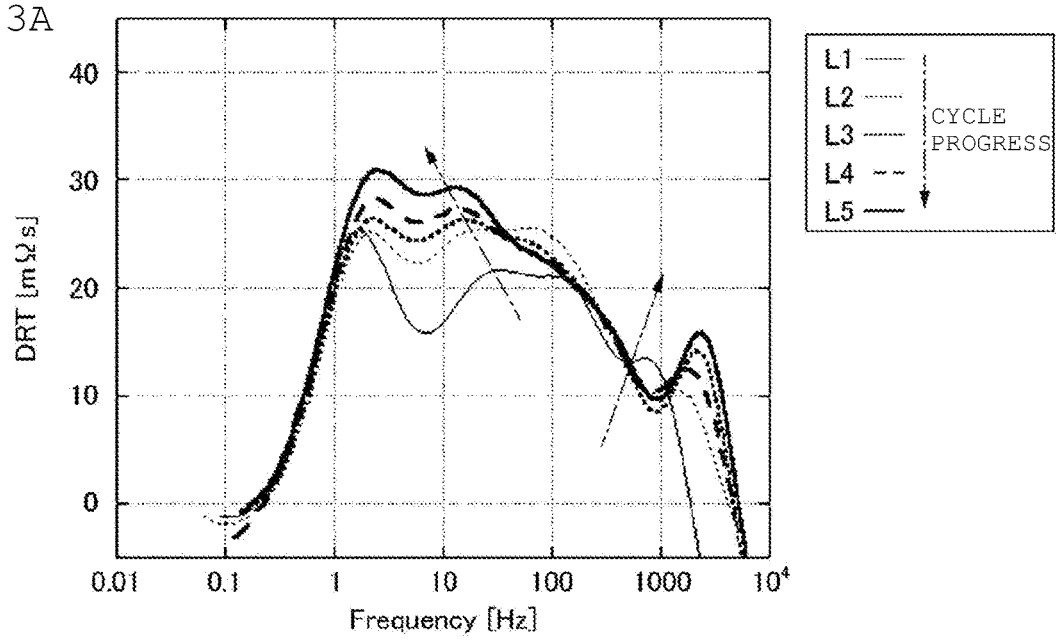
FIGS. 13A and 13B are views illustrating relaxation time distributions in the reference example.
Figure 13B:
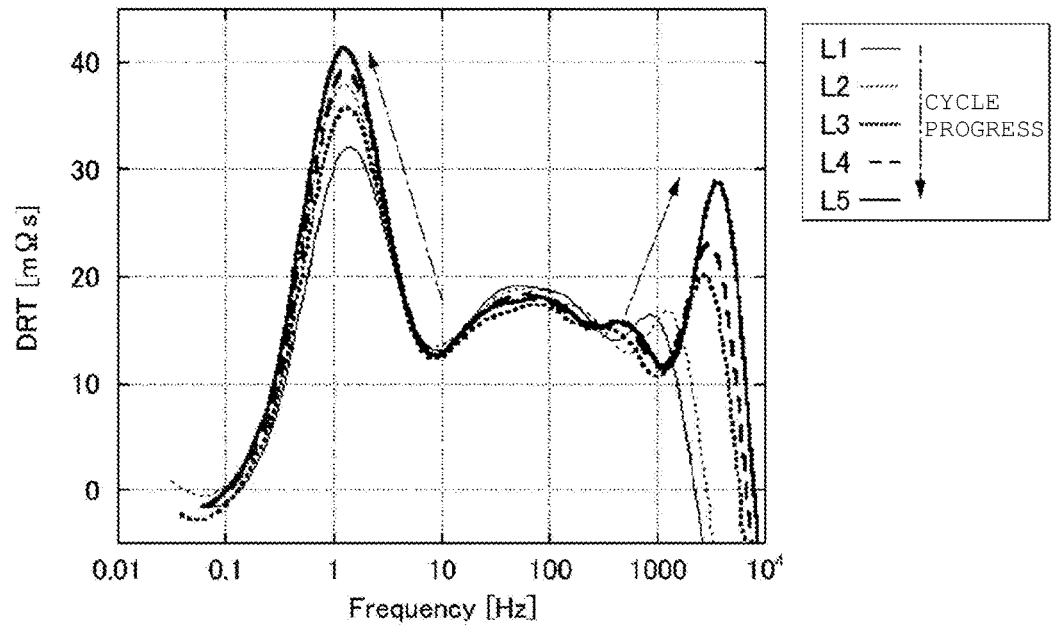

Therefore, in the present example, the relaxation time distribution was determined from the data shown in FIGS. 12A and 12B. The results are shown in FIG. 13A and FIG. 13B. In FIG. 13, the horizontal axis represents the frequency and the vertical axis represents DRT. In the relaxation time distribution shown in FIG. 13, it is observed that separation into nearly four peaks is observed, and the difference in the frequency region which changes in accordance with the cycle temperature is clearly separated. In the batteries of cycle at 10° C., the region mainly around 10 Hz grow, and in the battery of cycle at 45° C., the region mainly around 1 Hz grow with the cycle. Also, in the batteries of cycle at 10° C., the region mainly around 50 Hz growing with cycles.

Figure 14A:
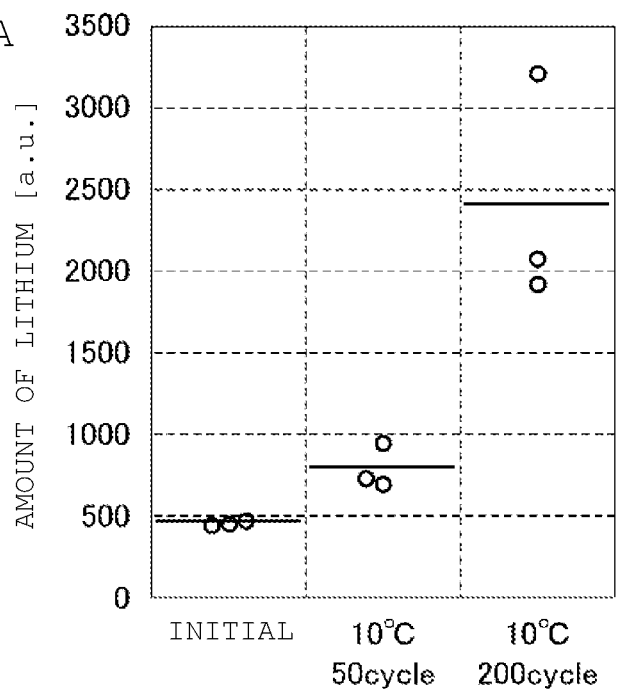
FIGS. 14A and 14B are views illustrating evaluation results regarding the amount of lithium on the negative electrode surface in the reference example.
Figure 14B:
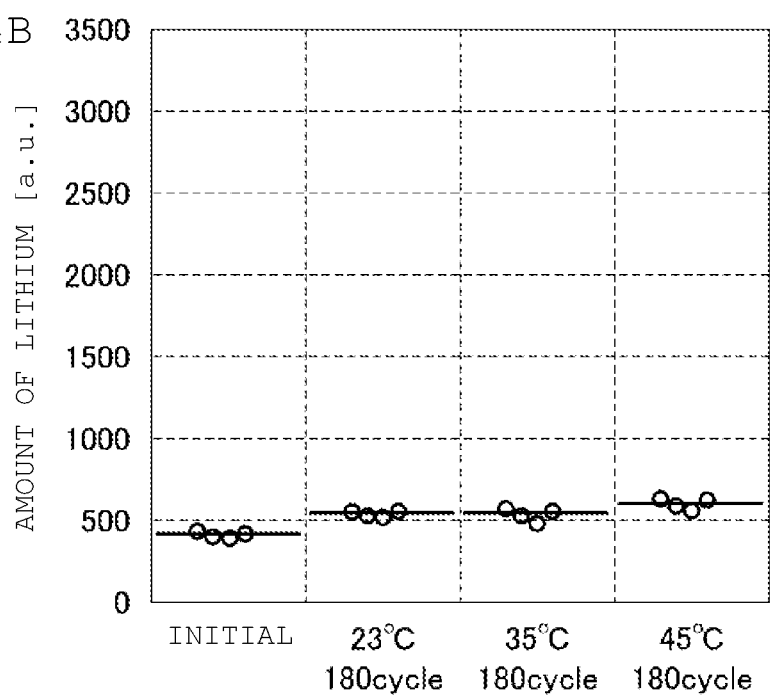

FIGS. 14A and 14B show the results of examining the amount of lithium on the surface of the negative electrode by glow discharge optical emission spectroscopy by disassembling the batteries before the cycle and the batteries that were cycled at each temperature in the discharge state of around 200 cycles. In low-temperature cycle batteries, the amount of increase in the lithium amount is particularly large, indicating that the coating on the surface of the negative electrode active material grow. On the other hand, the change is small in high temperature cycle batteries. This corresponds to the behavior near 10 Hz in the DRT plot.

Figure 15:
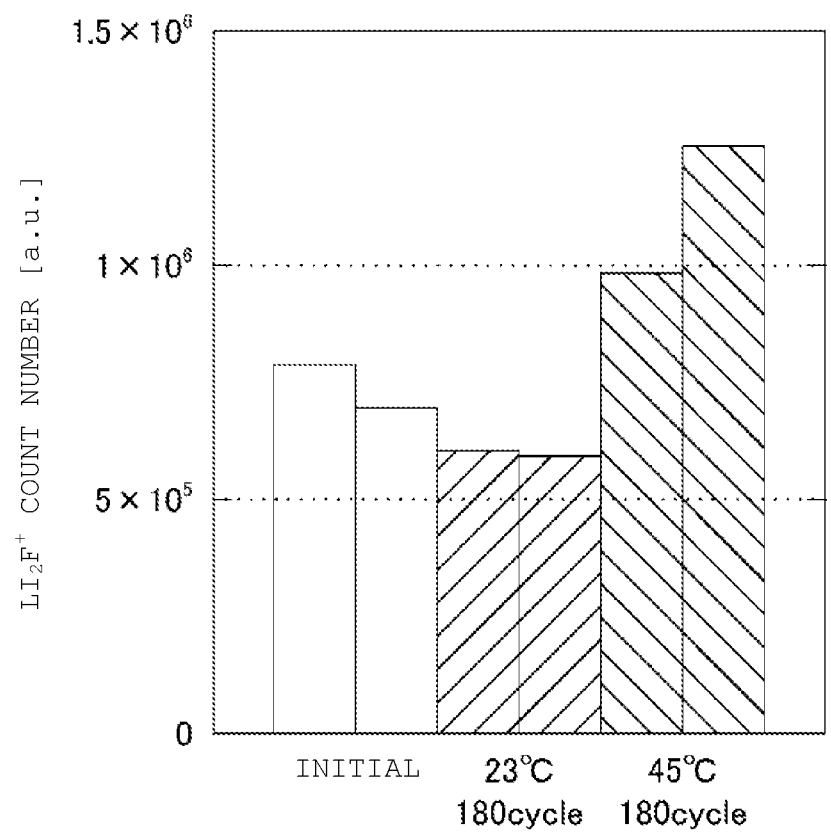
FIG. 15 is a view illustrating the evaluation results on an amount of the lithium fluoride coating of a positive electrode in the reference example.

FIG. 15 shows the results of disassembling batteries before the cycle and batteries cycled at 23° C. and 45° C. in the discharge state of around 200 cycles and examining the amount of the lithium fluoride coating film of the positive electrode ($Li_2F^+$ ion species evaluated as count number) by a time-of-flight secondary ion mass spectrometry. It is understood that the amount of increase in lithium fluoride amount is particularly large in the high temperature cycle batteries as compared with the case where it is close to a low temperature of 23° C., and the coatings on the surface of the positive electrode active material grow. This corresponds to the behavior near 1 Hz in the DRT plot. From the above results, it is possible to make correspondence between frequency behavior in the DRT plot and deterioration phenomena in the battery, and therefore it is possible to analyze the state inside the battery relatively simply and accurately. It is considered that growth in the frequency band of 1 kHz or more corresponds to deterioration of at least one of the positive electrode and the negative electrode.

For example, the configurations, methods, steps, shapes, materials, numerical values and the like described in the above embodiments are merely examples, and configurations, methods, steps, shapes, materials and numerical values different from those described above may be employed as required.

The present technology is described below in further detail according to an embodiment.

(1)

An analytical device including a battery condition analysis section that detects a state change of a constituent member of a battery based on a change in peak of a relaxation time in a predetermined frequency band.

(2)

The analytical device according to the above (1), in which the battery condition analysis section detects a state change of the constituent member of the battery based on a change in peak of a relaxation time in a first frequency band and a second frequency band.

(3)

The analytical device according to the above (2), in which the battery condition analysis section detects a state change of a first constituent member of the battery based on a change in peak of a relaxation time in the first frequency band, and detects a state change of a second constituent member of the battery based on a change in peak of a relaxation time in the second frequency band.

(4)

The analytical device according to the above (3), in which
the second frequency band is a frequency band higher than the first frequency band,
the first constituent member is a positive electrode, and
the second constituent member is a negative electrode.

(5)

The analytical device according to any one of the above (1) to (4), in which the battery condition analysis section identifies which constituent member of the battery changes in a state based on a change in peak of a relaxation time in each of a plurality of frequency bands.

(6)

The analytical device according to any one of the above (1) to (5), in which the battery condition analysis section determines a relaxation time distribution of a frequency band appearing in an arc shape on the Nyquist diagram obtained based on the measurement result of an AC impedance of the battery.

(7)

The analytical device according to any one of the above (1) to (6), in which the battery is a lithium ion secondary battery.

(8)

The analytical device according to any one of the above (1) to (7), in which the state change of the constituent member is deterioration of the constituent member.

(9)

An analytical device including a battery condition analysis section that detects a state of a constituent member of a battery based on a peak of a relaxation time in a predetermined frequency band.

(10)

The analytical device according to the above (9), in which the state of the constituent member is a state of a coating of the electrode.

(11)

An analysis method for detecting a state change of a constituent member of a battery based on a change in peak of a relaxation time in a predetermined frequency band by a battery condition analysis section.

(12)

A method for manufacturing a battery, including the steps of:

assembling constituent members of a battery; and detecting a state change of the constituent members of a battery based on a peak of a relaxation time in a predetermined frequency band by a battery condition analysis section.

(13)

An electric storage device including:

a battery; and a battery condition analysis section that detects a state change of a constituent member of the battery based on a change in peak of a relaxation time in a predetermined frequency band.

(14)

An electric storage system including:

the electric storage device according to the above (13); and a control part for controlling the electric storage device.

(15)

An electronic device that is connected to the electric storage device according to the above (13) and receives supply of electric power from the electric storage device.

(16)

An electric vehicle including:

the electric storage device according to the above (13); and a conversion device that receives supply of electric power from the electric storage device and converts the electric power into a driving force of a vehicle.

(17)

The electric vehicle according to the above (16) further including a control device that performs information processing on vehicle control based on information on the electric storage device.

(18)

An electric power system including the electric storage device according to the above (13), in which the electric power system receives supply of electric power from the electric storage device.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A battery analytical device, comprising:

a battery condition analysis section including an alternating current generator, a voltage measuring section and a calculating section, wherein the alternating current generator is configured to generate an alternating current with a constant amplitude and provide the alternating current to a battery, and wherein the battery condition analysis section including the alternating current generator is configured to detect a state change of a constituent member of the battery based on a change in peak of a relaxation time distribution in a predetermined frequency band, wherein the battery condition analysis section determines deterioration of a positive electrode of the battery in a case that the change in peak of the relaxation time distribution at 1 to 10 Hz is equal to or more than a first predetermined value, and wherein the battery condition analysis section determines deterioration of a negative electrode of the battery in a case that the change in peak of the relaxation time distribution at 10 to 100 Hz is equal to or more than a second predetermined value.

2. The battery analytical device according to claim 1, wherein the battery condition analysis section is configured to identify the constituent member of the battery.

3. The battery analytical device according to claim 1, wherein the battery condition analysis section is configured to determine the relaxation time distribution of a frequency band with an arc shape on a Nyquist diagram obtained from a measurement result of an AC impedance of the battery.

4. The battery analytical device according to claim 1, wherein the battery includes a lithium ion secondary battery.

5. The battery analytical device according to claim 1, wherein the state change of the constituent member indicates deterioration of the constituent member.

6. An electric storage device comprising:

a battery; and the battery analytical device according to claim 1, wherein the battery is connected to the battery analytical device.

7. An electric storage system comprising:

the electric storage device according to claim 6; and a processor that controls the electric storage device.

8. An electric vehicle comprising:

the electric storage device according to claim 6; and a conversion device including a motor configured to receive supply of electric power from the electric storage device and convert the electric power into a driving force of a vehicle.

9. The electric vehicle according to claim 8 further comprising an information processing device.

10. An electric power system comprising the electric storage device according to claim 6, wherein the electric storage device is a power supply.

* * * * *